(12) United States Patent
Sadayuki

(10) Patent No.: US 6,519,175 B2
(45) Date of Patent: Feb. 11, 2003

(54) FERROELECTRIC MEMORY DEVICE

(75) Inventor: Eiichi Sadayuki, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/006,154

(22) Filed: Dec. 10, 2001

(65) Prior Publication Data

US 2002/0080642 A1 Jun. 27, 2002

(30) Foreign Application Priority Data

Dec. 22, 2000  (JP) ........................................ 2000-390764

(51) Int. Cl.[7] .............................. G11C 11/22; G11C 7/06
(52) U.S. Cl. ........................ 365/145; 365/205; 365/208
(58) Field of Search ................................ 365/145, 149, 365/205, 207, 208, 210

(56) References Cited

U.S. PATENT DOCUMENTS

| | | | | |
|---|---|---|---|---|
| 5,901,088 A | * | 5/1999 | Kraus ........................... 327/52 |
| 5,926,413 A | | 7/1999 | Yamada et al. ............. 365/145 |
| 6,278,630 B1 | * | 8/2001 | Yamada ....................... 365/145 |
| 6,288,950 B1 | * | 9/2001 | Koike ........................ 365/145 |

FOREIGN PATENT DOCUMENTS

JP      2-301093      12/1990

* cited by examiner

Primary Examiner—Son Mai
(74) Attorney, Agent, or Firm—Stevens, Davis, Miller & Mosher, LLP

(57) ABSTRACT

An object is to enable the reference level to be generated without the use of a dummy cell in a ferroelectric memory device having a single-transistor, single-capacitor memory cell structure. To achieve this object, a P-type MOS transistor is additionally connected between two nodes which are control terminals of a sense amplifier, and an offset is generated in the sense amplifier. To one of the nodes, a sense amplifier control signal is directly input, and to the other node, the sense amplifier control signal is input through the P-type MOS transistor. The offset level of the sense amplifier is set by setting the potential of the offset control signal which is the gate input of the P-type MOS transistor. Consequently, the reference level can be generated without the use of a dummy cell. As a result, a high-speed, high-reliability ferroelectric memory device can be provided.

26 Claims, 14 Drawing Sheets

FERROELECTRIC MEMORY DEVICE

BACKGROUND OF THE INVENTION

1. Field of the Invention

The present invention relates to readout of a ferroelectric memory device having a single-transistor, single-capacitor (1T1C) memory cell structure.

2. Description of the Prior Art

In ferroelectric memory devices having the 1T1C memory cell structure, it is necessary to generate a reference level to determine whether the data in the memory cell is '0' or '1' when the data is read out. A method of generating the reference level uses a dummy cell. An example of this method is disclosed in Japanese Laid-open Patent Application No. H02-301093. The method disclosed in Japanese Laid-open Patent Application No. H02-301093 will be described with reference to FIG. 14.

FIG. 14 is a circuit diagram of a conventional ferroelectric memory device. The ferroelectric memory device in FIG. 14 comprises a memory cell MC in which data is stored, a dummy cell DMC generating the reference level, and a sense amplifier 10C determining whether the data in the memory cell is '0' or '1'. The memory cell MC is selected by a word line WL, and a plate line PL is driven, so that a signal potential is generated on a bit line BL1. The dummy cell DMC is selected by a word line DWL, and a plate line DPL is driven, so that a reference potential is generated on the bit line BL2.

As a ferroelectric capacitor DC of the dummy cell DMC, a capacitor having a smaller size than a ferroelectric capacitor C of the memory cell MC is used. That is, a level intermediate between the levels of the data '0' and the data '1' in the memory cell MC is generated by making the size of the ferroelectric capacitor DC of the dummy cell DMC different from the ferroelectric capacitor C of the memory cell MC. The reference level is adjusted by adjusting the size of the ferroelectric capacitor DC of the dummy cell DMC.

FIG. 14 shows a case where the number of memory cells MC is one. However, in ordinary cases, a plurality of memory cells, for example, 64 to 256 memory cells are connected to the bit line BL1. On the contrary, the number of dummy cells DMC is one.

In the above-described ferroelectric memory device, the generation of the reference level is realized by using a dummy cell.

However, in the conventional ferroelectric memory device, since the number of memory cells MC connected to one bit line is large unlike the number of dummy cells DMC connected to one bit line, the access frequency of the dummy cell is higher than that of the memory cells MC. Consequently, the dummy cell DMC deteriorates soon. The deterioration of the dummy cell DMC changes the reference level from the initially set one to a different one, so that the data in the memory cell MC cannot be read out correctly.

Moreover, in the conventional ferroelectric memory device, it is necessary to write predetermined data into the dummy cell DMC before performing reading, to generate a constant reference level. Since it is necessary to write the same data as the predetermined data every time irrespective of the data in the memory cell MC, a period for writing into the dummy cell DMC is required in addition to the period for writing into the memory cell MC.

Moreover, in the conventional ferroelectric memory device, the capacitor size of the dummy cell DMC is designed so that a level intermediate between the levels of the reading signals '0' and '1' of the memory cell MC is generated. However, in this designing of the capacitor size of the dummy cell DMC, it is necessary to previously estimate the levels of the reading signals '0' and '1' of the memory cell MC and the levels of the reading signals when the capacitor size is changed to one for the dummy cell DMC. This makes it difficult to design the capacitor size of the dummy cell DMC.

Moreover, in the conventional ferroelectric memory device, the capacitor size of the dummy cell DMC is decided in the design phase, and cannot easily be changed thereafter. This makes it difficult to always ensure a reading operation margin for sample characteristic variations in a case such that the ferroelectric memory device is mass-produced.

SUMMARY OF THE INVENTION

An object of the present invention is to provide a high-speed, high-reliability ferroelectric memory device in which the reference level can be generated without the use of a dummy cell.

Another object of the present invention is to provide a ferroelectric memory device in which the reference level is easily designed in the design phase of the ferroelectric memory device.

Still another object of the present invention is to provide a ferroelectric memory device in which the reference level can easily be changed even after the design phase of the ferroelectric memory device.

A ferroelectric memory device of the present invention comprises: first and second bit lines; a first memory cell transistor; a first ferroelectric capacitor connected to the first bit line through the first memory cell transistor, said first ferroelectric capacitor being included in a first memory cell array; a sense amplifier connected to the first and second bit lines, and having first and second control terminals corresponding to the first and second bit lines; and a offset generating transistor connected between the first and second control terminals, and supplying an offset to the sense amplifier.

According to this structure, by additionally connecting the offset generating transistor between the first and second control terminals of the sense amplifier, the reference level can be generated without the use of a dummy cell. As a result, a high-speed, high-reliability ferroelectric memory device can be provided.

In the above-described ferroelectric memory device, an example of the sense amplifier comprises: a first P-type MOS transistor having its gate connected to the second bit line, its drain connected to the first bit line, and its source connected to the first control terminal; a second P-type MOS transistor having its gate connected to the first bit line, its drain connected to the second bit line, and its source connected to the second control terminal; a first N-type MOS transistor having its gate connected to the second bit line, its drain connected to the first bit line, and its source connected to a third control terminal; and a second N-type MOS transistor having its gate connected to the first bit line, its drain connected to the second bit line, and its source connected to the third control terminal.

Moreover, the offset generating transistor comprises a third P-type MOS transistor having its source and drain connected to the first and second control terminals, and a control signal of the sense amplifier is input to the second control terminal.

According to this structure, the same effects as those of the above-described ferroelectric memory device are produced.

In the above-described ferroelectric memory device, a second example of the sense amplifier comprises: a first P-type MOS transistor having its gate connected to the second bit line, its drain connected to a first data line, and its source connected to the first control terminal; and a second P-type MOS transistor having its gate connected to the first bit line, its drain connected to a second data line, and its source connected to the second control terminal.

Moreover, the offset generating transistor comprises a third P-type MOS transistor having its source and drain connected to the first and second control terminals, and a control signal of the sense amplifier is input to the second control terminal.

According to this structure, the same effects as those of the above-described ferroelectric memory device are produced.

In the above-described ferroelectric memory device, a third example of the sense amplifier comprises: a first N-type MOS transistor having its gate connected to the second bit line, its drain connected to the first bit line, and its source connected to the first control terminal; a second N-type MOS transistor having its gate connected to the first bit line, its drain connected to the second bit line, and its source connected to the second control terminal; a first P-type MOS transistor having its gate connected to the second bit line, its drain connected to the first bit line, and its source connected to a third control terminal; and a second P-type MOS transistor having its gate connected to the first bit line, its drain connected to the second bit line, and its source connected to the third control terminal.

Moreover, the offset generating transistor comprises a third N-type MOS transistor having its source and drain connected to the first and second control terminals, and a control signal of the sense amplifier is input to the second control terminal.

According to this structure, the same effects as those of the above-described ferroelectric memory device are produced.

In the above-described ferroelectric memory device, a fourth example of the sense amplifier comprises: a first N-type MOS transistor having its gate connected to the second bit line, its drain connected to the first data line, and its source connected to the first control terminal; and a second N-type MOS transistor having its gate connected to the first bit line, its drain connected to the second data line, and its source connected to the second control terminal.

Moreover, the offset generating transistor comprises a third N-type MOS transistor having its source and drain connected to the first and second control terminals, and a control signal of the sense amplifier is input to the second control terminal.

According to this structure, the same effects as those of the above-described ferroelectric memory device are produced.

In the ferroelectric memory device having the first or the second example of the sense amplifier, it is preferable to set an offset level Voffset of the sense amplifier by setting a gate potential Vg of the third P-type MOS transistor based on the following relationship:

$$Voffset = Vg - Vtp$$

where Vg is the gate potential of the third P-type MOS transistor, Vtp is a threshold voltage of the third P-type MOS transistor, and Voffset is the offset level of the sense amplifier.

According to this structure, since the offset level of the sense amplifier can be set by setting the gate potential of the MOS transistor for offset generation, the reference level can easily be designed in the design phase of the ferroelectric memory device.

In the ferroelectric memory device having the third or the fourth example of the sense amplifier, it is preferable to set an offset level Voffset of the sense amplifier by setting a gate potential Vg of the third N-type MOS transistor based on the following relationship:

$$Voffset = Vg - Vtn - VDD$$

where Vg is the gate potential of the third N-type MOS transistor, Vtn is a threshold voltage of the third N-type MOS transistor, Voffset is the offset level of the sense amplifier, and VDD is a power supply voltage.

According to this structure, since the offset level of the sense amplifier can be set by setting the gate potential of the MOS transistor for offset generation, the reference level can easily be designed in the design phase of the ferroelectric memory device.

The ferroelectric memory device having the first or the second example of the sense amplifier may further comprise: an offset control signal generating circuit setting a potential that is input to a gate of the third P-type MOS transistor; and a pad connected to the gate of the third P-type MOS transistor.

According to this structure, by providing the offset control signal generating circuit and the pad, the gate potential of the third P-type MOS transistor can be adjusted. This enables the offset level of the sense amplifier to be adjusted. Consequently, the reference level can easily be changed even after the design phase of the ferroelectric memory device. As a result, a reading operation margin can always be ensured for sample characteristic variations in a case such that the ferroelectric memory device is mass-produced.

In the ferroelectric memory device having the first or the second example of the sense amplifier, a structure having: first and second terminals to which a first predetermined voltage and a second predetermined voltage are applied, respectively; a plurality of resistors connected in series between the first and second terminals; a plurality of fuses connected in parallel to the resistors, respectively; and a third terminal outputting an offset control signal from one of points of connection between the resistors can be considered as a first example of the offset control signal generating circuit.

According to this structure, not only the same effects as those of the above-described ferroelectric memory device having the offset control signal generating circuit and the pad are produced but also the reference level can be adjusted even after the design phase. As a result, a reading operation margin can always be ensured for sample characteristic variations in a case such that the ferroelectric memory device is mass-produced.

In the ferroelectric memory device having the first or the second example of the sense amplifier, a structure having: first and second terminals to which a first predetermined voltage and a second predetermined voltage are applied, respectively; a plurality of resistors connected in series between the first and second terminals; a plurality of switches connected in parallel to the resistors, respectively; a third terminal outputting an offset control signal from one of points of connection between the resistors; a second memory cell array in which setting of the switches is stored; means for reading out data in the second memory cell array, and controlling on/off of the switches; means for writing data into the second memory cell array from outside a chip; and means for reading out data in the second memory cell array, to outside the chip can be considered as a second example of the offset control signal generating circuit.

According to this structure, not only the same effects as those of the above-described ferroelectric memory device having the offset control signal generating circuit and the pad are produced but also the offset level can be set even after the chip is sealed in a package because no fuses requiring cutting are used.

The ferroelectric memory device having the third or the fourth example of the sense amplifier may further comprise: an offset control signal generating circuit setting a potential that is input to a gate of the third N-type MOS transistor; and a pad connected to the gate of the third N-type MOS transistor.

According to this structure, by providing the offset control signal generating circuit and the pad, the gate potential of the third N-type MOS transistor can be adjusted. This enables the offset level of the sense amplifier to be adjusted. Consequently, the reference level can easily be changed even after the design phase of the ferroelectric memory device. As a result, a reading operation margin can always be ensured for sample characteristic variations in a case such that the ferroelectric memory device is mass-produced.

In the ferroelectric memory device having the third or the fourth example of the sense amplifier, a structure having: first and second terminals to which a first predetermined voltage and a second predetermined voltage are applied, respectively; a plurality of resistors connected in series between the first and second terminals; a plurality of fuses connected in parallel to the resistors, respectively; and a third terminal outputting an offset control signal from one of points of connection between the resistors can be considered as a first example of the offset control signal generating circuit.

According to this structure, not only the same effects as those of the above-described ferroelectric memory device having the offset control signal generating circuit and the pad are produced but also the reference level can be adjusted even after the design phase. As a result, a reading operation margin can always be ensured for sample characteristic variations in a case such that the ferroelectric memory device is mass-produced.

In the ferroelectric memory device having the third or the fourth example of the sense amplifier, a structure having: first and second terminals to which a first predetermined voltage and a second predetermined voltage are applied, respectively; a plurality of resistors connected in series between the first and second terminals; a plurality of switches connected in parallel to the resistors, respectively; a third terminal outputting an offset control signal from one of points of connection between the resistors; a second memory cell array in which setting of the switches is stored; means for reading out data in the second memory cell array, and controlling on/off of the switches; means for writing data into the second memory cell array from outside a chip; and means for reading out data in the second memory cell array, to outside the chip can be considered as a second example of the offset control signal generating circuit.

According to this structure, not only the same effects as those of the above-described ferroelectric memory device having the offset control signal generating circuit and the pad are produced but also the offset level can be set even after the chip is sealed in a package because no fuses requiring cutting are used.

In the ferroelectric memory device having the first, the second, the third or the fourth example of the sense amplifier, a structure having means for precharging the first and second control terminals to a predetermined voltage may be adopted.

According to this structure, by providing the precharging circuit, the control terminals of the sense amplifier can be precharged with reliability. As a result, the reading operation can more accurately be performed.

The above-described ferroelectric memory device may further comprise: a second memory cell transistor; a second ferroelectric capacitor connected to the second bit line through the second memory cell transistor, said second ferroelectric capacitor being included in the first memory cell array; and a selecting circuit connecting a control signal of the sense amplifier to the second control terminal when data in the first ferroelectric capacitor is read out, and connecting the control signal of the sense amplifier to the first control terminal when data in the second ferroelectric capacitor is read out.

According to this structure, by providing the selecting circuit, data can be read out not only onto the first bit line but also onto the second bit line by connecting the second memory cell transistor and the second ferroelectric capacitor. As a result, a denser memory cell array can be structured.

DESCRIPTION OF THE PREFERRED EMBODIMENTS

Figure 1:
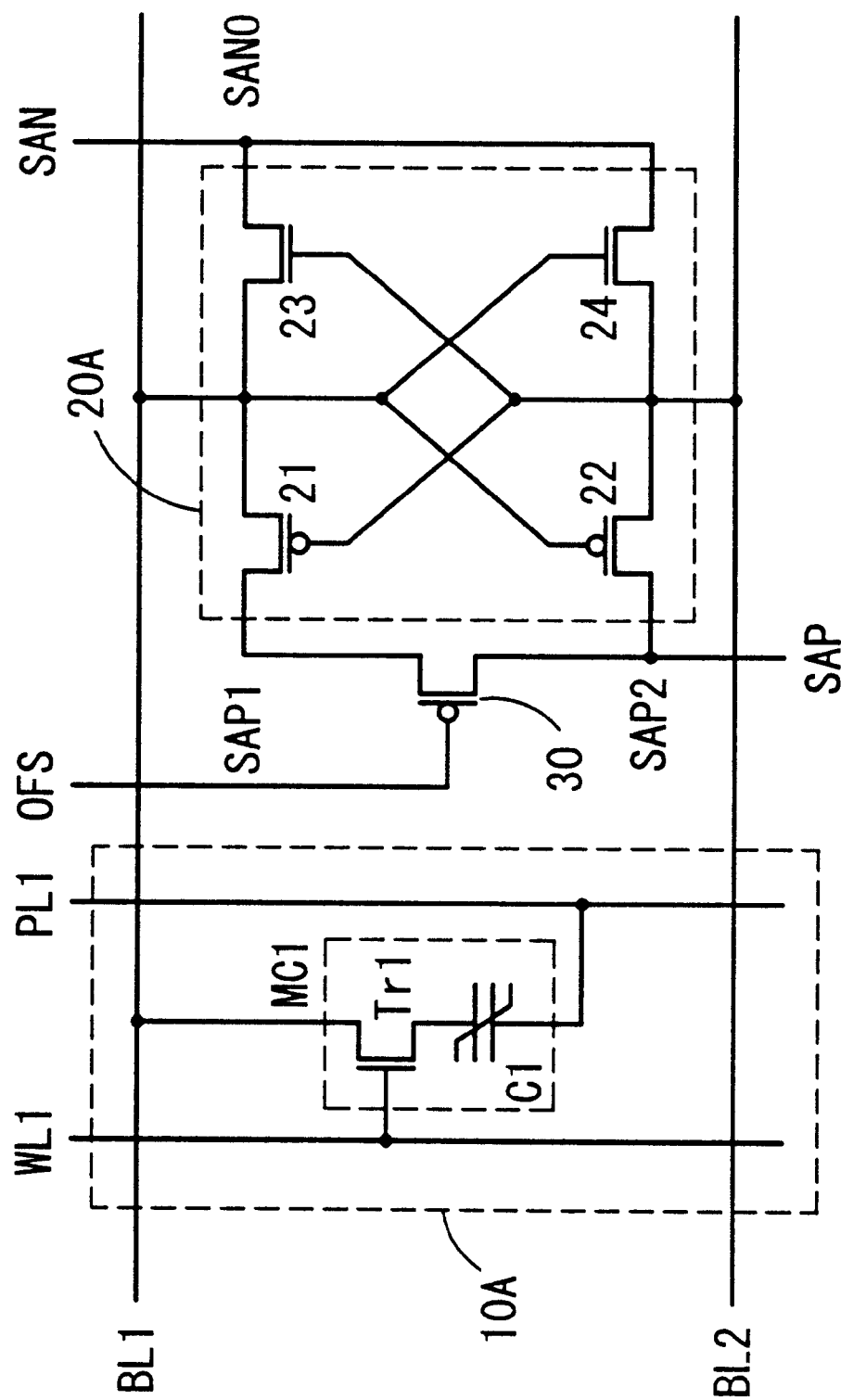
FIG. 1 is a circuit diagram showing the structure of a ferroelectric memory device according to a first embodiment of the present invention.

FIG. 1 is a circuit diagram showing the structure of a ferroelectric memory device according to a first embodiment of the present invention. In FIG. 1, reference designation 10A represents a memory cell array, reference designation Tr1 represents a memory cell transistor, reference designation C1 represents a ferroelectric capacitor, reference designation. MC1 represents a memory cell, reference designation WL1 represents a word line, reference designations BL1 and BL2 represent bit lines, reference designation PL1 represents a plate line, reference designation 20A represents a sense amplifier, reference designations 21 and 22 represent P-type MOS (metal oxide semiconductor) transistors, reference designations 23 and 24 represent N-type MOS transistors, and reference designation 30 represents a P-type MOS transistor.

The ferroelectric capacitor C1 has one terminal connected to the plate line PL1 and its other terminal connected to the source or drain of the memory cell transistor Tr1. The memory cell transistor Tr1 has its gate connected to the word line WL1 and its drain or source connected to the ferroelectric capacitor C1 and the bit line BL1. The memory cell MC1 is a unit comprising the ferroelectric capacitor C1 and the memory cell transistor Tr1. The memory cell array 10A is a block comprising a plurality of memory cells, a plurality of word lines and a plurality of pairs of bit lines. However, only one of each of these is shown in FIG. 1. The memory cell MC1 is selected by the word line WL1, and the plate line PL1 is driven, so that the data in the ferroelectric capacitor C1 is read out onto the bit line BL1.

The sense amplifier 20A is of a cross coupling type. That is, the gates of the P-type MOS transistors 21 and 22 are connected to the bit lines BL2 and BL1, respectively. The drains of the P-type MOS transistors 21 and 22 are connected to the bit lines BL1 and BL2, respectively. The sources of the P-type MOS transistors 21 and 22 are connected to a node SAP1 which is a first control terminal and a node SAP2 which is a second control terminal, respectively. A sense amplifier control signal SAP is applied to the node SAP2.

The gates of the N-type MOS transistors 23 and 24 are connected to the bit lines BL2 and BL1, respectively. The drains of the N-type MOS transistors 23 and 24 are connected to the bit lines BL1 and BL2, respectively. The sources of the N-type MOS transistors 23 and 24 are both connected to a node SAN0 which is a third control terminal to which a sense amplifier control signal SAN is applied.

The sense amplifier 20A senses the data on the bit lines BL1 and BL2 by the sense amplifier control signals SAP and SAN, and amplifies the data.

The P-type MOS transistor 30 has its gate connected to the line of an offset control signal OFS and its source and drain connected to the nodes SAP1 and SAP2. The input node of the sense amplifier control signal SAP is connected to the node SAP2 as mentioned above. Consequently, the sense amplifier control signal SAP is directly transmitted to the node SAP2, and is transmitted to the node SAP1 through the P-type MOS transistor 30.

Figure 2:
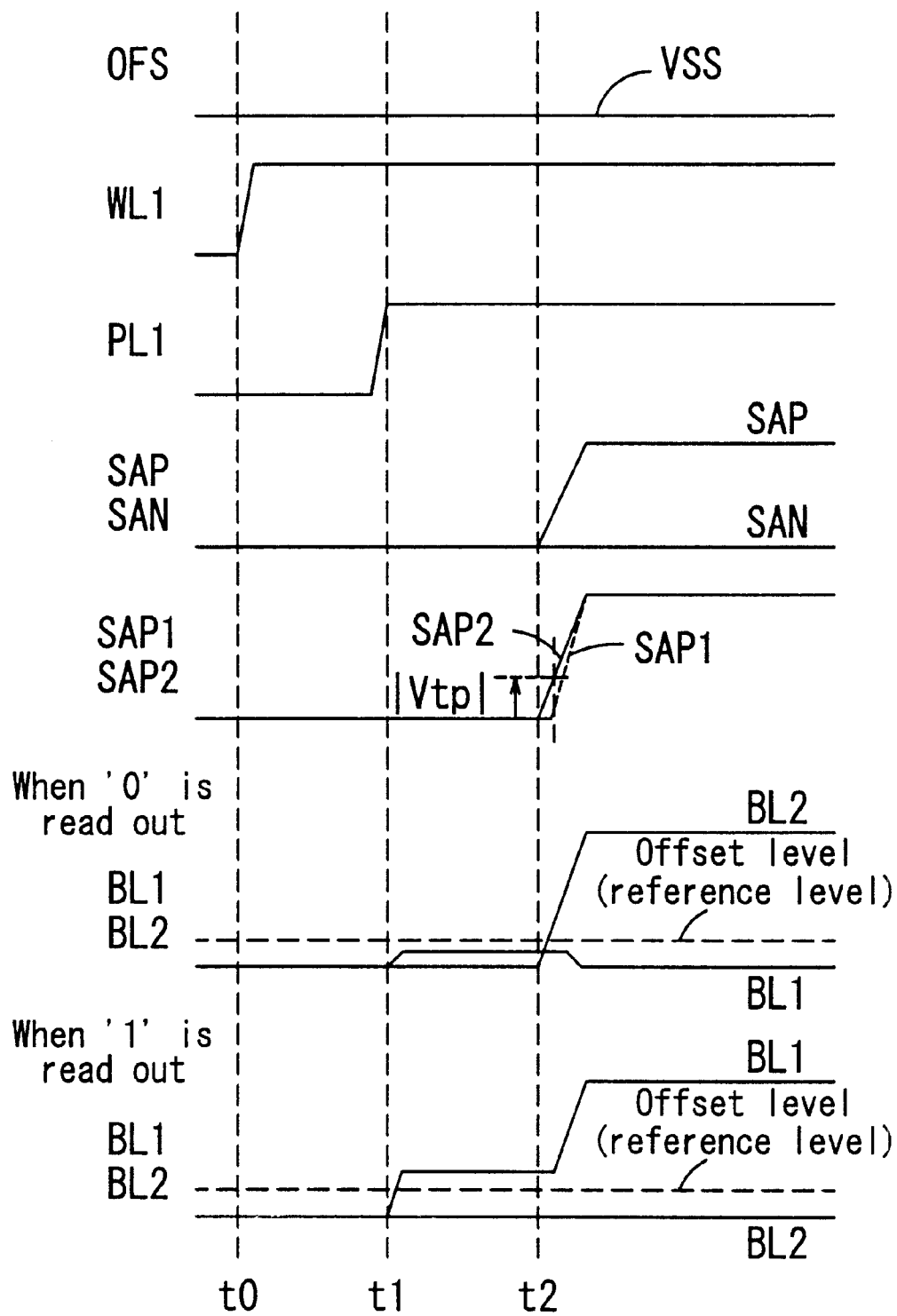
FIG. 2 is a time sequence diagram showing an operation of the ferroelectric memory device according to the first embodiment of the present invention.

A reading operation of the ferroelectric memory device according to the first embodiment of the present invention will be described with reference to FIG. 2. FIG. 2 is a time sequence diagram showing the operation of the ferroelectric memory device according to the first embodiment. Changes of the potentials of the control signals OFS, WL1, PL1, SAP, SAN, SAP1 and SAP2, the potentials of the bit lines BL1 and BL2 when the memory cell data '0' is read out, and the potentials of the bit lines BL1 and BL2 when the memory cell data '1' is read out are shown in FIG. 2.

The potentials of the control signals in FIG. 2 when the control signals are low are a ground voltage VSS, and the potentials when the control signals are high are a power supply voltage VDD. When an internal power supply circuit is used, the potentials when the control signals are high maybe an internal voltage VINT.

The potential of the offset control signal OFS is constant at the ground voltage VSS. The absolute value of the threshold voltage Vtp of the P-type MOS transistor 30 is the median value between the bit line signal voltage when the data '0' in the memory cell MC1 is read out and the bit line signal voltage when the data '1' is read out. The bit line signal voltages are potential differences with the ground voltage VSS as the reference.

The bit lines BL1 and BL2 are precharged to the ground voltage VSS in the present embodiment. The potential of the sense amplifier control signal SAN is constant at the ground voltage VSS because the N-type MOS transistors 23 and 24 of the sense amplifier 20A do not function to sense data.

The operation performed when the data in the memory cell MC1 is '0' will be described with reference to FIG. 2. The bit lines BL1 and BL2 are precharged to the ground voltage VSS before a time t0.

At time t0, the potential of the word line WL1 is made high to turn on the memory cell transistor Tr1, and at time t1, the potential of the plate line PL1 is made high. Then, the charge in the ferroelectric capacitor C1 is redistributed between the plate line PL1 and the bit line BL1, so that the signal in the ferroelectric capacitor C1 is read out onto the bit line BL1.

At time t2, the sense amplifier control signal SAP is caused to make a low-to-high transition. The potential of the node SAP2 and the potential of the sense amplifier control signal SAP become the same because the node SAP2 is directly connected to the input node of the sense amplifier control signal SAP. The potential of the node SAP1 remains at the ground voltage VSS until the potential of the node SAP2 becomes equal to or higher than the threshold value |Vtp| of the P-type MOS transistor 30.

When the potential of the sense amplifier control signal SAP exceeds |Vtp|, the P-type MOS transistor 30 is turned on, and the potential of the node SAP1 increases with the sense amplifier control signal SAP. At this time, the node SAP1 which is the source of the P-type MOS transistor 21 is lower by Vtp | than the node SAP2 which is the source of the P-type MOS transistor 22. This difference is the offset level of the sense amplifier 20A. The dotted lines in FIG. 2 show the offset level, which is the apparent potential of the bit line BL2.

After all, the offset level of the sense amplifier 20A is the reference level for the bit line BL1. When the data '0' is read out, since the potential of the bit line BL1 is lower than the offset level, the potential of the bit line BL1 is amplified up to the ground voltage VSS and the potential of the bit line BL2 is amplified up to the power supply voltage VDD.

The data '0' can be read out from the memory cell MC1 by the above-described operation.

When the data in the memory cell MC1 is '1', since the signal potential of the bit line BL1 is higher than the offset level shown by the dotted lines as shown in FIG. 2, the potential of the bit line BL1 is amplified up to the power supply voltage VDD and the potential of the bit line BL2 is amplified up to the ground voltage VSS, so that the data '1' can be read out.

As described above, by additionally connecting the P-type MOS transistor 30 between the nodes SAP1 and SAP2 and generating the offset in the sense amplifier 20A, the reference level can be generated without the use of a dummy cell.

Figure 3:
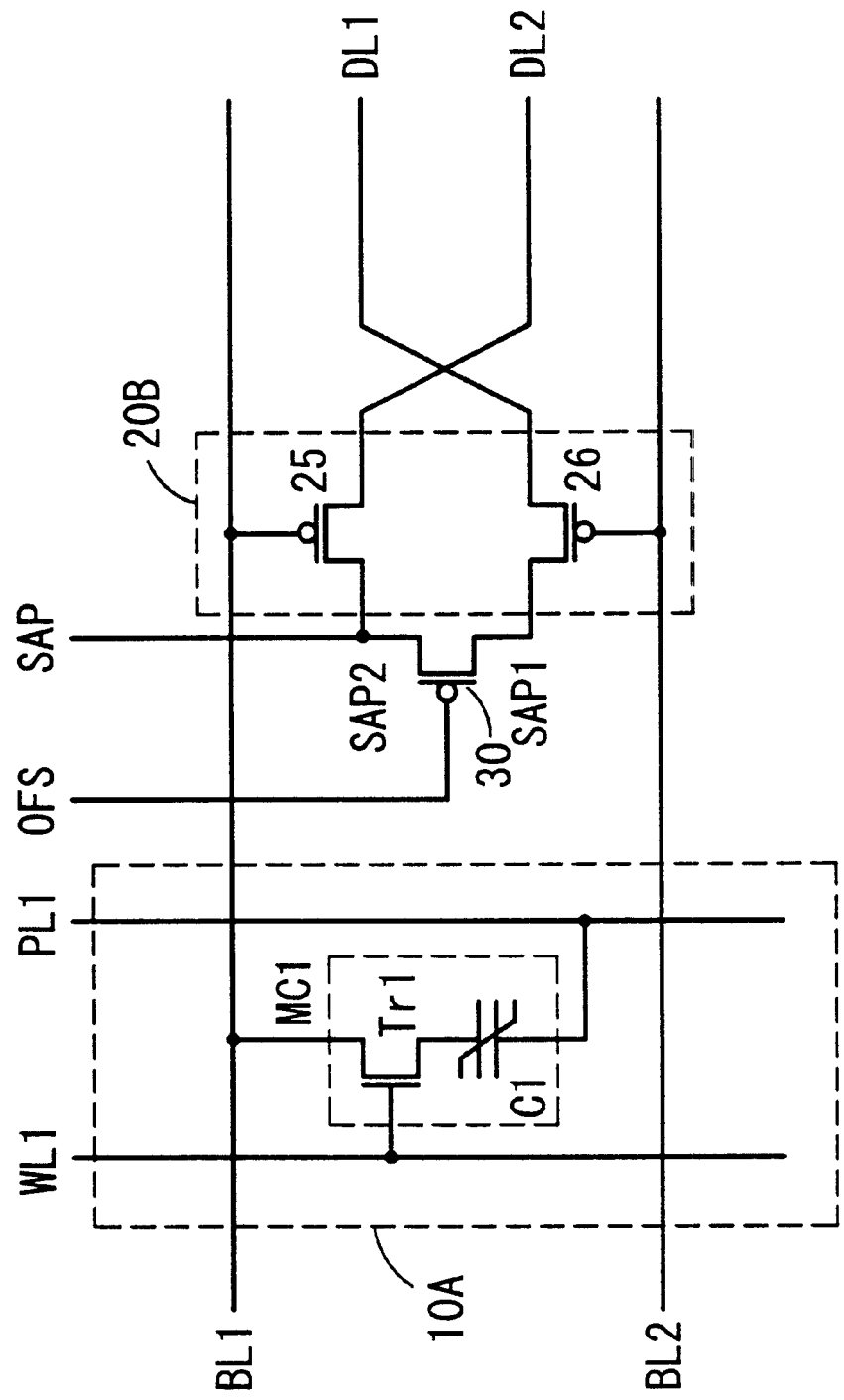
FIG. 3 is a circuit diagram showing the structure of a ferroelectric memory device according to a second embodiment of the present invention.

FIG. 3 is a circuit diagram showing the structure of a ferroelectric memory device according to a second embodiment of the present invention. In FIG. 3, reference designation 10A represents a memory cell array, reference designation Tr1 represents a memory cell transistor, reference designation C1 represents a ferroelectric capacitor, reference designation MC1 represents a memory cell, reference designation WL1 represents a word line, reference designations BL1 and BL2 represent bit lines, reference designations DL1 and DL2 represent data lines, reference designation PL1 represents a plate line, reference designation 20B represents a sense amplifier, reference designations 25 and 26 represent P-type MOS transistors, and reference designation 30 represents a P-type MOS transistor.

The memory cell array 10A and the P-type MOS transistor 30 have the same structures as those of FIG. 1 showing the first embodiment. The following two points are different from the structure of FIG. 1: Firstly, the data lines DL1 and DL2 are added. Secondly, in the sense amplifier 20B, the P-type MOS transistor 25 has its gate connected to the bit line BL1, its drain connected to the data line DL2 and its source connected to the node SAP2, and the P-type MOS transistor 26 has its gate connected to the bit line BL2, its drain connected to the data line DL1 and its source connected to the node SAP1.

The P-type MOS transistors 25 and 26 in FIG. 3 being equivalent to the P-type MOS transistors 22 and 21, respectively, the operation in the second embodiment is the same as that in the first embodiment shown in FIG. 2. That is, the sense amplifier control signal SAP is transmitted to the node SAP1 later than to the node SAP2 because of the P-type MOS transistor 30, so that an offset is generated in the sense amplifier 20B.

As described above, in the circuit structure shown in the second embodiment, an offset can be generated in the sense amplifier 20B by the P-type MOS transistor 30, and the reference level can be generated without the use of a dummy cell.

Figure 4:
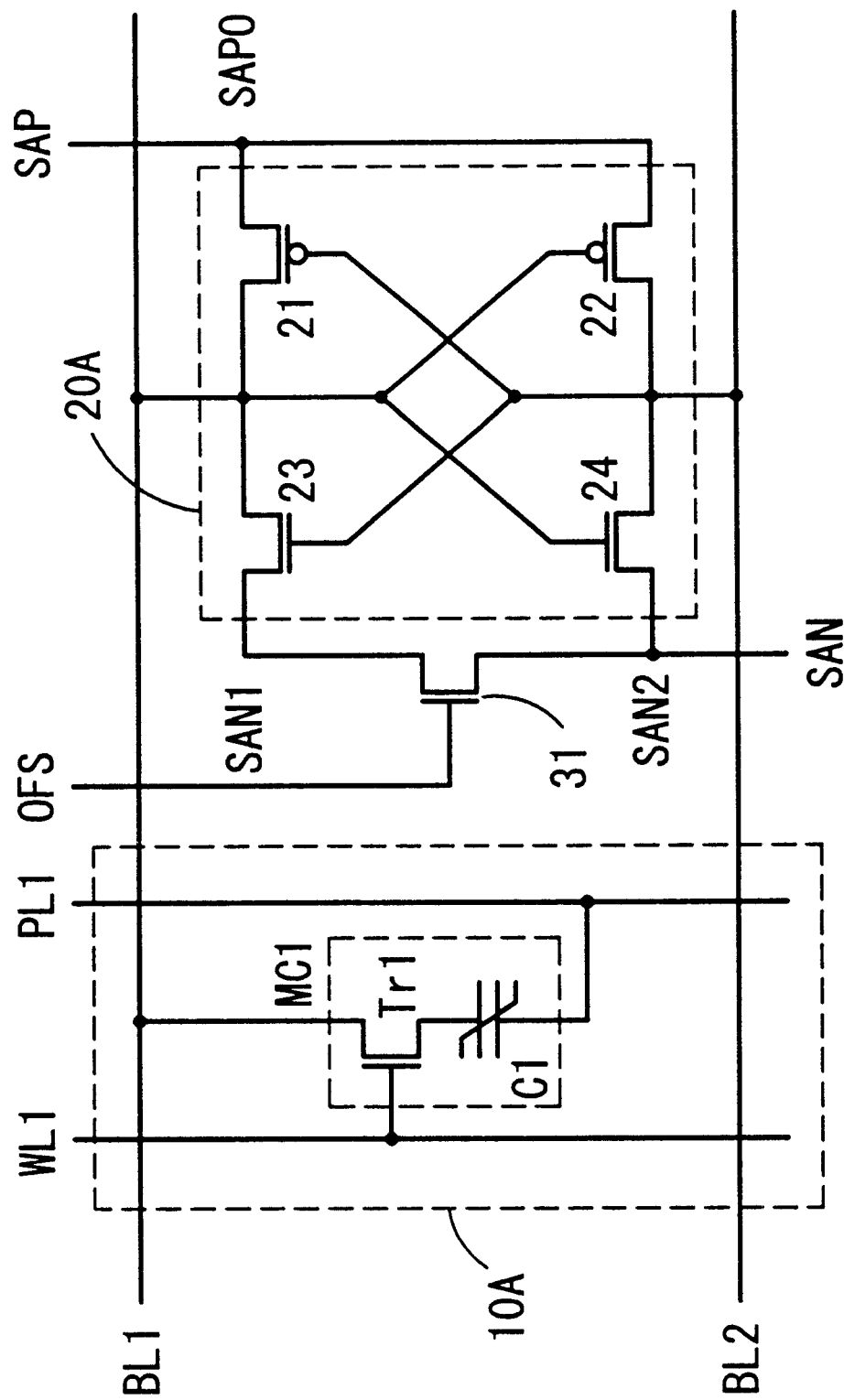
FIG. 4 is a circuit diagram showing the structure of a ferroelectric memory device according to a third embodiment of the present invention.

FIG. 4 is a circuit diagram showing the structure of a ferroelectric memory device according to a third embodiment of the present invention. In FIG. 4, reference designation 10A represents a memory cell array, reference designation Tr1 represents a memory cell transistor, reference designation C1 represents a ferroelectric capacitor, reference designation MC1 represents a memory cell, reference designation WL1 represents a word line, reference designations BL1 and BL2 represent bit lines, reference designation PL1 represents a plate line, reference designation 20A represents a sense amplifier, reference designations 21 and 22 represent P-type MOS transistors, reference designations 23 and 24 represent N-type MOS transistors, and reference designation 31 represents an N-type MOS transistor.

The memory cell array 10A has the same structure as that of FIG. 1 showing the first embodiment. The following two points are different from the structure of FIG. 1: Firstly, in the sense amplifier 20A, the sources of the P-type MOS transistors 21 and 22 are both connected to a node SAP0 which is a third control terminal to which the sense amplifier control signal SAP is applied, and the sources of the N-type MOS transistors 23 and 24 are connected to a node SAN1 which is a first control terminal and a node SAN2 which is a second control terminal, respectively. Secondly, the N-type MOS transistor 31 is used instead of the P-type MOS transistor 30 in FIG. 1, the N-type MOS transistor 31 has its gate connected to the line of the offset control signal OFS and its source and drain connected to the node SAN1 and the node SAN2, and the line of the sense amplifier control signal SAN is connected to the node SAN2.

Figure 5:
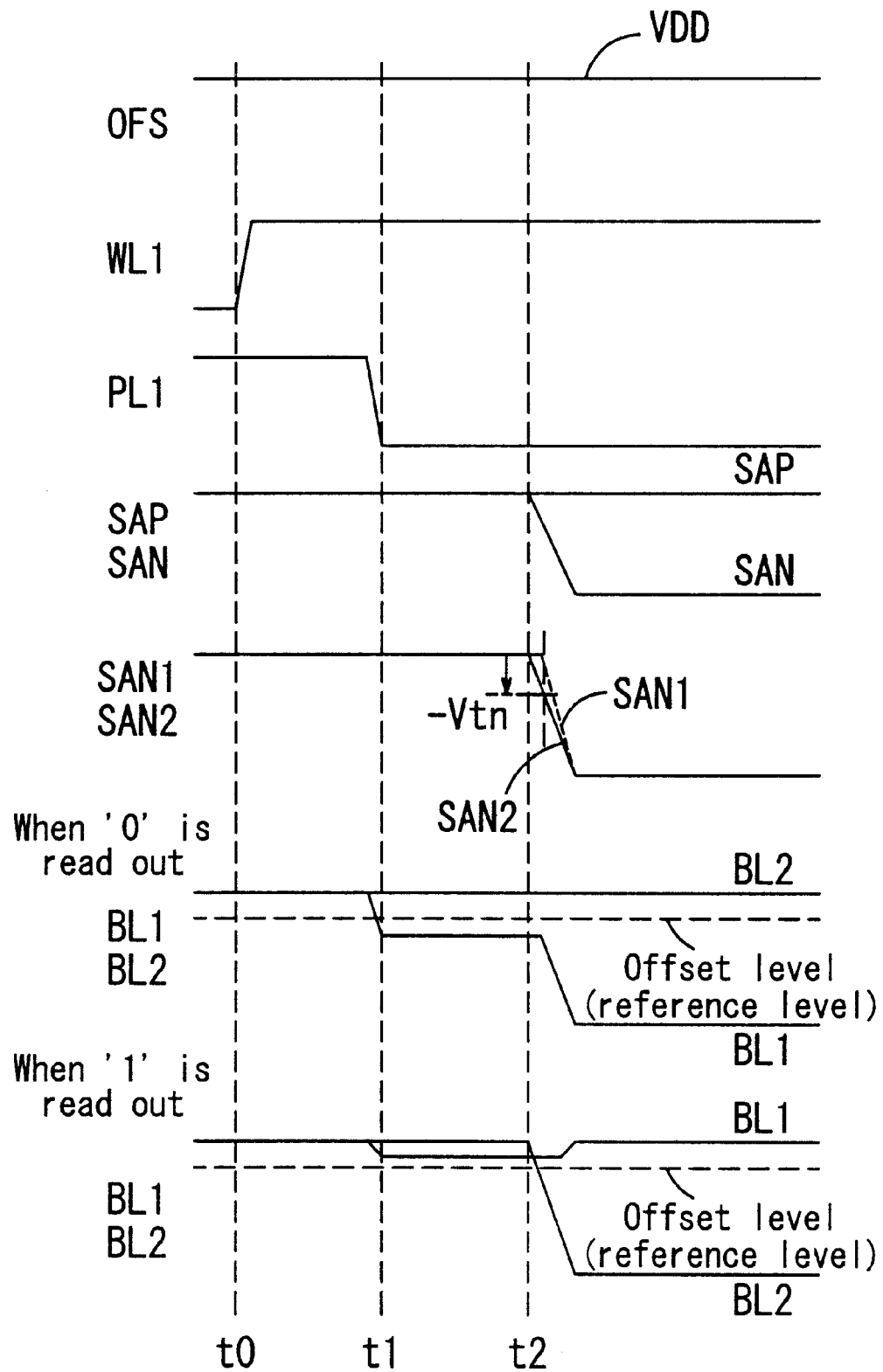
FIG. 5 is a time sequence diagram showing an operation of the ferroelectric memory device according to the third embodiment of the present invention.

A reading operation of the ferroelectric memory device according to the third embodiment of the present invention will be described with reference to FIG. 5. FIG. 5 is a time sequence diagram showing the operation of the ferroelectric memory device according to the third embodiment. Changes of the potentials of the control signals OFS, WL1, PL1, SAP, SAN, SAN1 and SAN2, the potentials of the bit lines BL1 and BL2 when the memory cell data '0' is read out, and the potentials of the bit lines BL1 and BL2 when the memory cell data '1' is read out are shown in FIG. 5.

The potentials of the control signals in FIG. 5 when the control signals are low are the ground voltage VSS, and the potentials when the control signals are high are the power supply voltage VDD. When an internal power supply circuit is used, the potentials when the control signals are high may be the internal voltage VINT.

The potential of the offset control signal OFS is constant at the power supply voltage VDD. The threshold voltage Vtn of the N-type MOS transistor 31 is the median value between the absolute value of the bit line signal voltage when the data '0' in the memory cell MC1 is read out and the absolute value of the bit line signal voltage when the data '1' is read out. The bit line signal voltages are potential differences with the power supply voltage VDD as the reference.

The bit lines BL1 and BL2 are precharged to the power supply voltage VDD in the present embodiment. The potential of the sense amplifier control signal SAP is constant at the power supply voltage VDD because the P-type MOS transistors 21 and 22 of the sense amplifier 20A do not function to sense data.

The operation performed when the data in the memory cell MC1 is '0' will be described with reference to FIG. 5. The bit lines BL1 and BL2 are precharged to the power supply voltage VDD before time t0.

At time t0, the potential of the word line WL1 is made high to turn on the memory cell transistor Tr1, and at time t1, the potential of the plate line PL1 is made low. Then, the charge in the ferroelectric capacitor C1 is redistributed between the plate line PL1 and the bit line BL1, so that the signal in the ferroelectric capacitor C1 is read out onto the bit line BL1.

At time t2, the sense amplifier control signal SAN is caused to make a low-to-high transition. The potential of the node SAN2 and the potential of the sense amplifier control signal SAN become the same because the node SAN2 is directly connected to the input node of the sense amplifier control signal SAN. The potential of the node SAN1 remains at the power supply voltage VDD until the potential of the node SAN2 becomes equal to or lower than VDD−Vtn.

When the potential of the sense amplifier control signal SAN becomes lower than VDD−Vtn, the N-type MOS transistor 31 is turned on, and the potential of the node SAN1 decreases with the sense amplifier control signal SAN. At this time, the node SAN1 which is the source of the N-type MOS transistor 23 is higher by Vtn than the node SAN2 which is the source of the N-type MOS transistor 24. This difference is the offset level of the sense amplifier 20A. The dotted lines in FIG. 5 show the offset level, which is the apparent potential of the bit line BL2.

After all, the offset level of the sense amplifier 20A is the reference level for the bit line BL1. When the data '0' is read out, since the potential of the bit line BL1 is lower than the offset level, the potential of the bit line BL1 is amplified up to the ground voltage VSS and the potential of the bit line BL2 is amplified up to the power supply voltage VDD.

The data '0' can be read out from the memory cell MC1 by the above-described operation.

When the data in the memory cell MC1 is '1', since the signal potential of the bit line BL is higher than the offset level shown by the dotted lines as shown in FIG. 5, the potential of the bit line BL1 is amplified up to the power supply voltage VDD and the potential of the bit line BL2 is amplified up to the ground voltage VSS, so that the data '1' can be read out.

As described above, by additionally connecting the N-type MOS transistor 31 between the nodes SAN1 and SAN2 and generating the offset in the sense amplifier 20A, the reference level can be generated without the use of a dummy cell.

Figure 6:
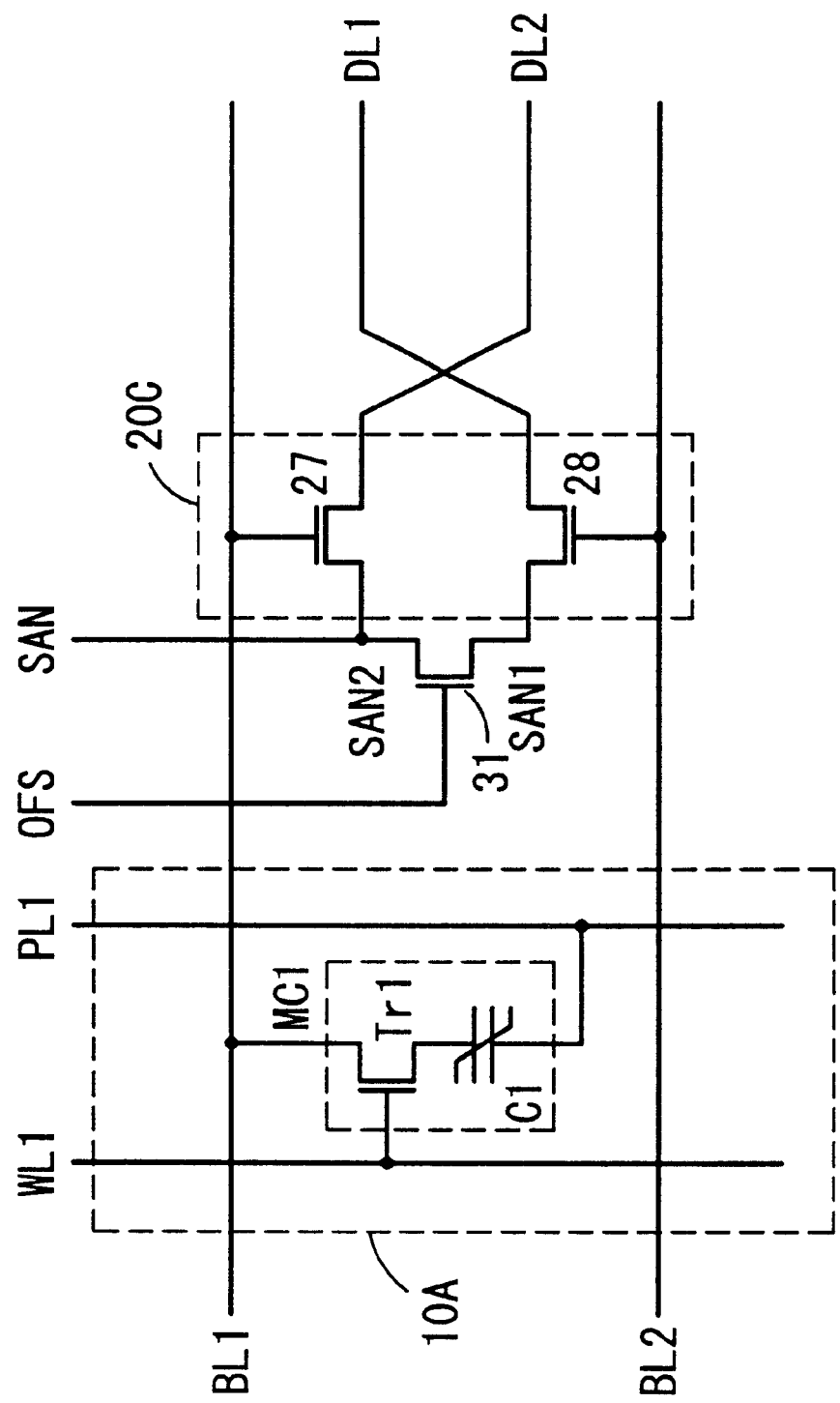
FIG. 6 is a circuit diagram showing the structure of a ferroelectric memory device according to a fourth embodiment of the present invention.

FIG. 6 is a circuit diagram showing the structure of a ferroelectric memory device according to a fourth embodiment of the present invention. In FIG. 6, reference designation 10A represents a memory cell array, reference designation Tr1 represents a memory cell transistor, reference designation C1 represents a ferroelectric capacitor, reference designation MC1 represents a memory cell, reference designation WL1 represents a word line, reference designations BL1 and BL2 represent bit lines, reference designations DL1 and DL2 represent data lines, reference designation PL1 represents a plate line, reference designation 20C represents a sense amplifier, reference designations 27 and 28 represent N-type MOS transistors, and reference designation 31 represents an N-type MOS transistor.

The memory cell array 10A and the N-type MOS transistor 31 have the same structures as those of FIG. 4 showing the third embodiment. The following two points are different from the structure of FIG. 4: Firstly, the data lines DL1 and DL2 are added. Secondly, in the sense amplifier 20C, the N-type MOS transistor 27 has its gate connected to the bit line BL1, its drain connected to the data line DL2 and its source connected to the node SAN2, and the N-type MOS transistor 28 has its gate connected to the bit line BL2, its drain connected to the data line DL1 and its source connected to the node SAN1.

The N-type MOS transistors 27 and 28 in FIG. 6 being equivalent to the N-type MOS transistors 25 and 24 in FIG. 4, respectively, the operation in the fourth embodiment is the same as that in the third embodiment shown in FIG. 5. That is, the sense amplifier control signal SAN is transmitted to the node SAN1 later than to the node SAN2 because of the N-type MOS transistor 31, so that an offset is generated in the sense amplifier 20C.

As described above, in the circuit structure shown in the fourth embodiment, an offset can be generated in the sense amplifier 20C by the N-type MOS transistor 31, and the reference level can be generated without the use of a dummy cell.

Next, setting of the offset level of the ferroelectric memory device according to the first or the second embodiment of the present invention will be described with reference to FIG. 7.

Figure 7:
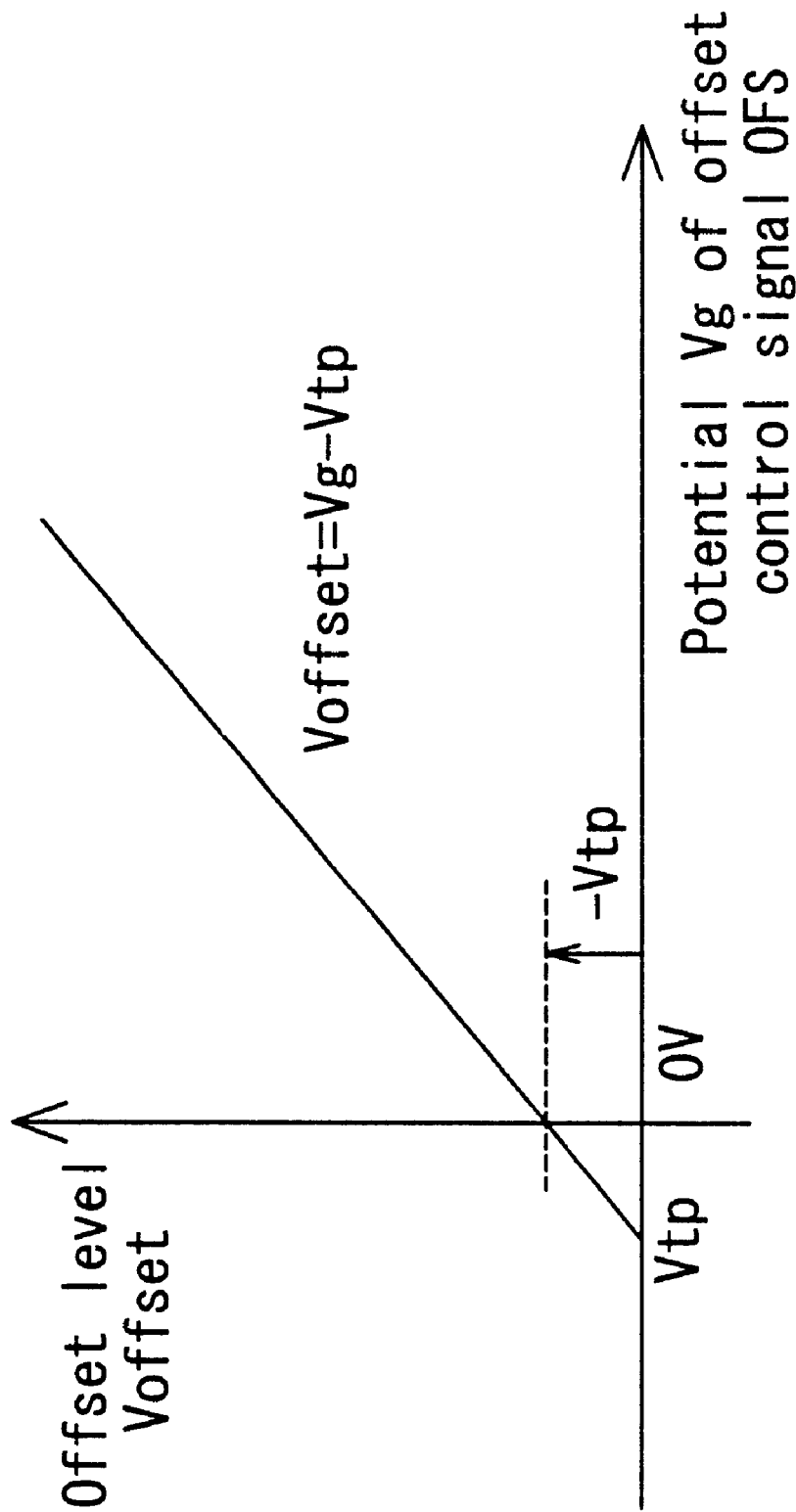
FIG. 7 is a graph showing a relationship between an offset setting signal OFS and an offset level with respect to setting of the offset level of the ferroelectric memory device according to the first or the second embodiment of the present invention.

FIG. 7 is a graph showing a relationship between the potential Vg of the offset control signal OFS which is the gate input of the P-type MOS transistor 30 shown in FIG. 1 or 3, and an offset level Voffset in the sensing operation. The horizontal axis represents the potential Vg of the offset control signal OFS. The vertical axis represents the offset level Voffset in the sensing operation.

The offset level Voffset is the source potential at which the transistor is turned on in the P-type MOS transistor 30. For example, when the gate input is the ground voltage VSS, since the P-type MOS transistor 30 is turned on by the source potential being −Vtp, the offset level Voffset is −Vtp.

After all, the offset level Voffset is expressed by $$Voffset = Vg - Vtp$$

where Vg is the gate potential of the P-type MOS transistor 30, and Vtp is the threshold voltage of the P-type MOS transistor 30.

In the description of the operation of the ferroelectric memory device according to the first or the second embodiment, the absolute value of the threshold voltage Vtp of the P-type MOS transistor 30 is the median value between the bit line signal voltage when the data '0' in the memory cell MC1 is read out and the bit line signal voltage when the data '1' is read out. The bit line signal voltages are potential differences with the ground voltage VSS as the reference.

However, an optimum potential Vg of the offset control signal OFS can be set from the relationship shown in FIG. 7 if the bit line signal voltage when the data '0' in the memory cell MC1 is read out, the bit line signal voltage when the data '1' is read out, and the threshold voltage Vtp of the P-type MOS transistor 30 are known in advance.

Next, setting of the offset level of the ferroelectric memory device according to the third or the fourth embodiment of the present invention will be described with reference to FIG. 8.

Figure 8:
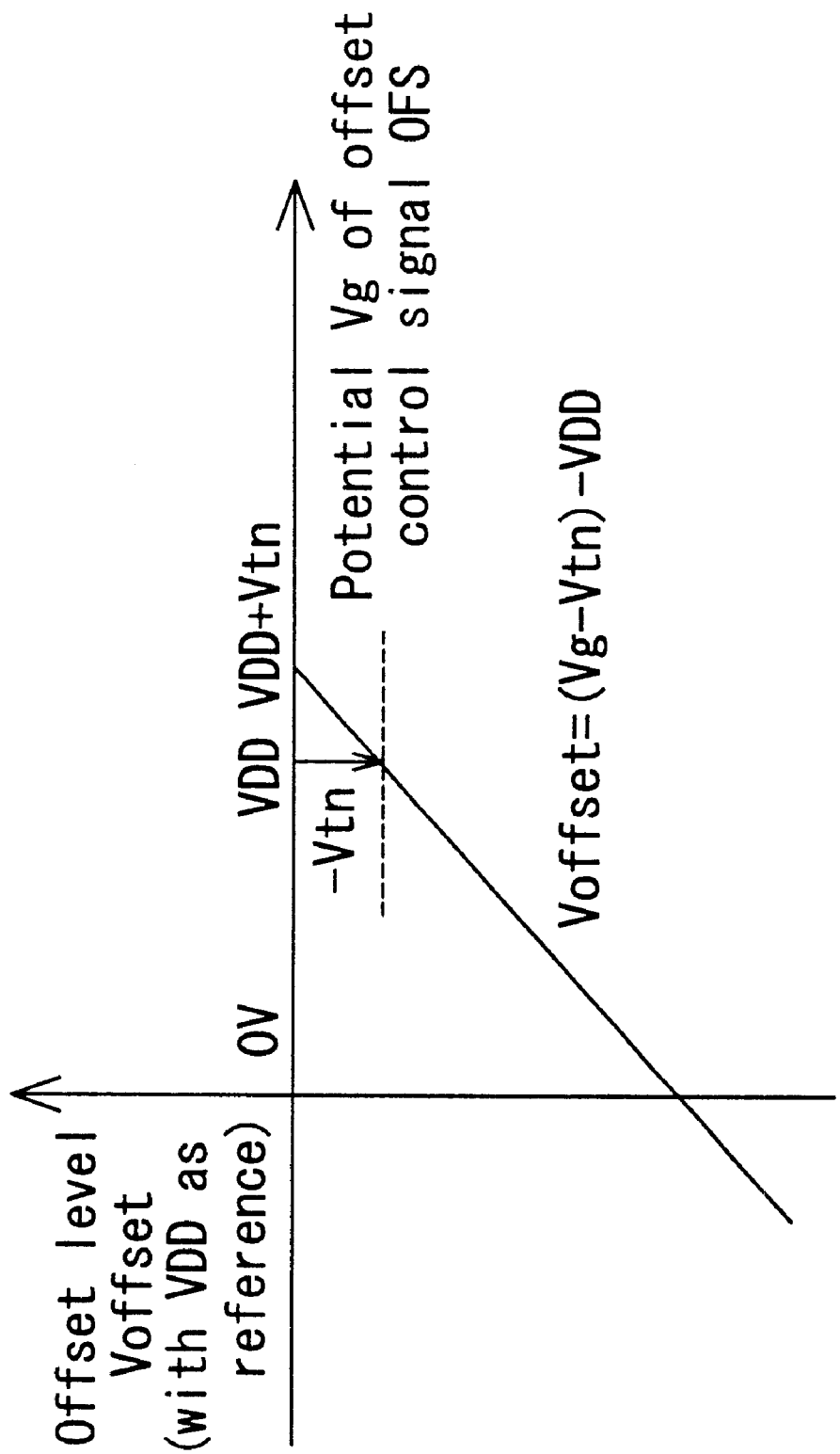
FIG. 8 is a graph showing a relationship between an offset setting signal OFS and an offset level with respect to setting of the offset level of the ferroelectric memory device according to the third the fourth embodiment of the present invention.

FIG. 8 is a graph showing a relationship between the potential Vg of the offset control signal OFS which is the gate input of the N-type MOS transistor 31 shown in FIG. 4 or 6, and an offset level Voffset in the sensing operation. The horizontal axis represents the potential Vg of the offset control signal OFS. The vertical axis represents the offset level Voffset in the sensing operation.

The offset level Voffset is with the power supply voltage VDD as the reference. The offset level Voffset is Vson-VDD, where Vson is the source potential at which the transistor is turned on in the N-type MOS transistor 31. For example, when the gate input is the power supply voltage VDD, since the N-type MOS transistor is turned on by the source potential being VDD−Vtn, the offset level Voffset is −Vtn.

After all, the offset level Voffset is expressed by $$Voffset = (Vg - Vtn) - VDD$$

where Vg is the gate potential of the N-type MOS transistor 31, Vtn is the threshold voltage of the N-type MOS transistor 31, and VDD is the power supply voltage.

In the description of the operation of the ferroelectric memory device according to the third or the fourth embodiment, the threshold voltage Vtn of the N-type MOS transistor 31 is the median value between the absolute value of the bit line signal voltage when the data '0' in the memory cell MC1 is read out and the absolute value of the bit line signal voltage when the data '1' is readout. The bit line signal voltages are potential differences with the power supply voltage VDD as the reference.

However, an optimum potential Vg of the offset control signal OFS can be set from the relationship shown in FIG.

8 if the bit line signal voltage when the data '0' in the memory cell MC1 is read out, the bit line signal voltage when the data '1' is read out, and the threshold voltage Vtn of the N-type MOS transistor 31 are known in advance.

Next, a ferroelectric memory device according to a fifth embodiment of the present invention will be described with reference to FIG. 9.

Figure 9:
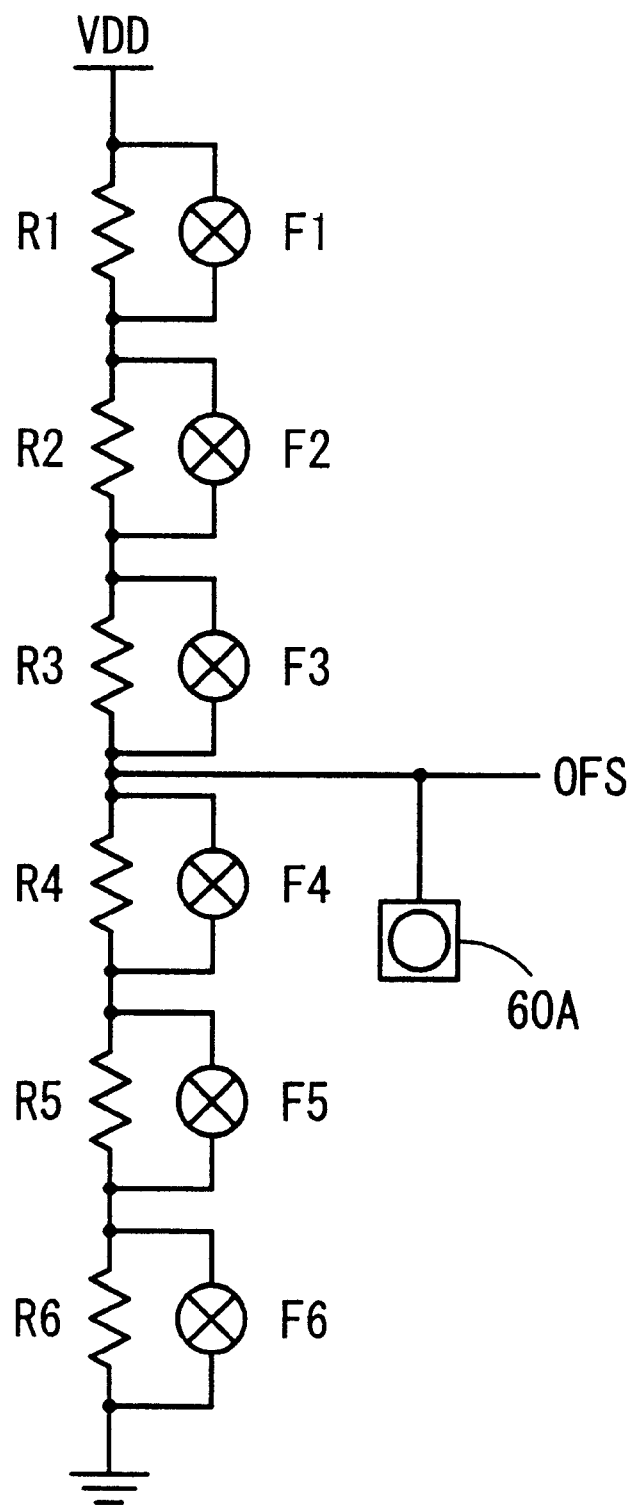
FIG. 9 is a circuit diagram showing the structure of a ferroelectric memory device according to a fifth embodiment of the present invention.

FIG. 9 is a circuit diagram specifically showing an offset control signal generating circuit generating the offset control signal OFS in FIGS. 1, 3, 4 or 6 showing the circuit diagram of the ferroelectric memory device of the first, the second, the third or the fourth embodiment of the present invention. In FIG. 9, reference designations R1 to R6 represent resistors, reference designations E1 to F6 represent fuses, and reference designation 60A represents a pad. While any given number of resistors and fuses may be provided in the offset control signal generating circuit, FIG. 9 shows a case where the number is six.

The resistors R1 to R6 are connected in series between the power supply voltage VDD and the ground voltage VSS. The fuses F1 to F6 are connected in parallel to the resistors R1 to R6, respectively. The offset control signal OFS is output from between the resistors R3 and R4, that is, from the point of connection between the resistors R3 and R4. The pad 60A is connected to the input node of the offset control signal OFS, so that the offset control signal OFS can be observed from outside the chip and a predetermined voltage can be applied as the offset control signal OFS from outside the chip.

By the resistances of the resistors R1 to R6 being higher than those of the fuses F1 to F6, the potential of the offset control signal OFS can arbitrarily be set in a range from the power supply voltage VDD to the ground voltage VSS according to which of the fuses F1 to F6 is cut. For example, when the fuses F1 to F4 are cut, the potential of the off set control signal OFS is set to $$(R4/(R1+R2+R3+R4)) \times VDD$$

While the resistors R1 to R6 are connected in series between the power supply voltage VDD and the ground voltage VSS in FIG. 9, the internal voltage VINT may be used instead of the power supply voltage VDD. Moreover, a negative voltage such as a substrate voltage VBB may be used instead of the ground voltage VSS. In particular, when a negative voltage such as the substrate voltage VBB is used instead of the ground voltage VSS, in the first and the second embodiments, the offset level Voffset can be set up to 0 V from the relationship between the offset control signal OFS and the offset level Voffset shown in FIG. 7. Moreover, similar effects are obtained when normally-on transistors are used instead of the resistors R1 to R6.

Next, how to use the offset control signal generating circuit shown in FIG. 9 will be described. First, a test of the reading operation of the ferroelectric memory device is performed while various voltages are applied to the pad 60A from outside the chip. As a result, the set potential of the offset control signal OFS most suitable for the chip being tested can be detected. Then, one or more of the fuses F1 to F6 are cut with a laser cutter or the like based on the set potential, whereby the voltage of the offset control signal OFS most suitable for the chip being tested can be set. By performing this procedure for each chip, the potential of the offset control signal OFS most suitable for each chip can be set.

While the pad 60A is used as means for applying voltages from outside the chip in the above-described structure, a test of whether the offset control signal generating circuit is generating a desired offset control signal OFS or not can be performed by measuring the potential of the offset control signal OFS through the pad 60A.

As described above, by using the offset control signal generating circuit shown in FIG. 9, the reference level can be adjusted even after the design phase. Consequently, a reading operation margin can always be ensured for sample characteristic variations in a case such that the ferroelectric memory device is mass-produced.

Next, a ferroelectric memory device according to a sixth embodiment of the present invention will be described with reference to FIGS. 10 and 11.

Figure 10:
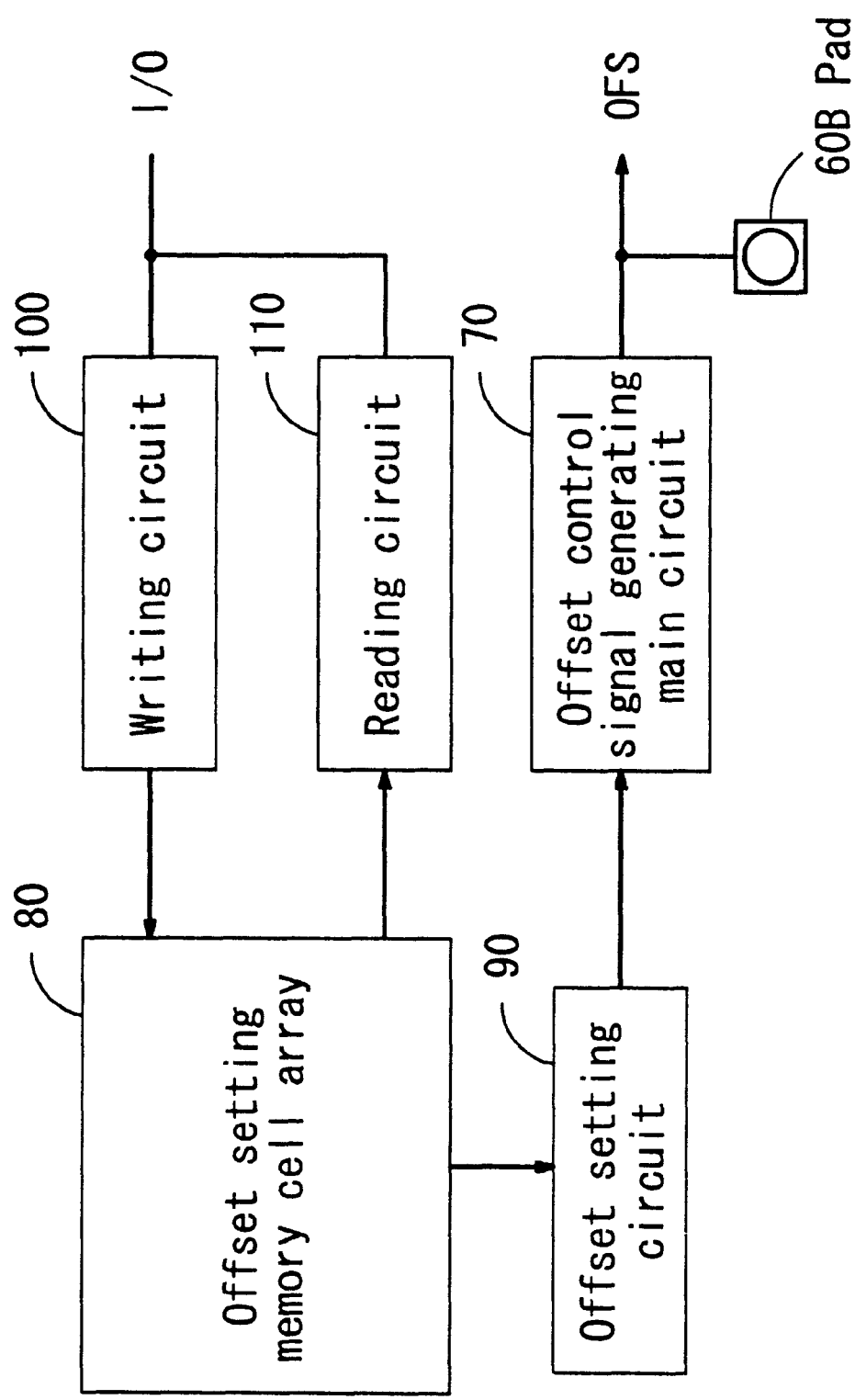
FIG. 10 is a block diagram showing the structure of a ferroelectric memory device according to a sixth embodiment of the present invention.

FIG. 10 is a block diagram specifically showing an offset control signal generating circuit generating the offset control signal OFS in FIG. 1, 3, 4 or 6 showing the circuit diagram of the ferroelectric memory device of the first, the second, the third or the fourth embodiment of the present invention. In FIG. 10, reference designation 60B represents a pad, reference designation 70 represents an offset control signal generating main circuit, reference designation 80 represents an offset setting memory cell array, reference designation 90 represents an offset setting circuit, reference designation 100 represents a writing circuit, and reference designation 110 represents a reading circuit.

The structure of the pad 60B is the same as that of FIG. 9 showing the ferroelectric memory device of the fifth embodiment. The offset control signal generating main circuit 70 generates the offset control signal OFS. The offset setting memory cell array 80 is provided separately from the memory cell of the main body, and offset setting data is stored therein. The offset setting circuit 90 reads out the data in the offset setting memory cell array 80, and sets the offset control signal generating main circuit 70 based on the data. The writing circuit 100 writes data input from outside the chip, into the offset setting memory cell array 80. The reading circuit 110 reads out the data in the offset setting memory cell array 80 to outside the chip. The data input and output from and to outside the chip for the writing and the reading circuits 100 and 110 are represented as I/O in FIG. 10.

Figure 11:
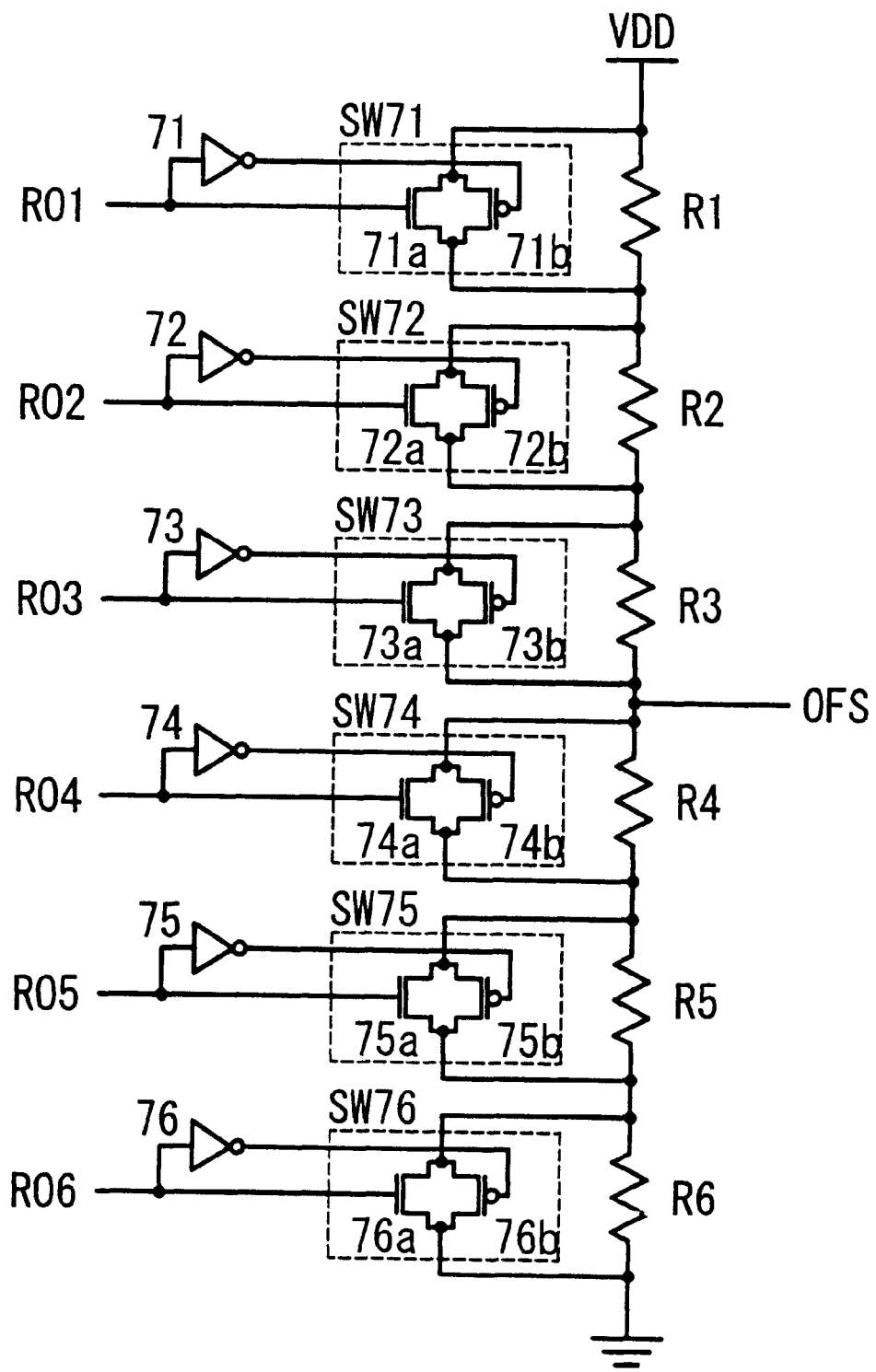
FIG. 11 is a circuit diagram showing the structure of the ferroelectric memory device according to the sixth embodiment of the present invention.

FIG. 11 is a circuit diagram concretely showing the structure of the offset control signal generating main circuit 70 shown in FIG. 10. In FIG. 11, reference designations R1 to R6 represent resistors, reference designations SW71 to SW76 represent switches, reference designations 71 to 76 represent inverters, reference designations 71a to 76a represent N-type MOS transistors, and reference designations 71b to 76b represent P-type MOS transistors. While any given number of resistors, switches and inverters may be provided in the offset control signal generating main circuit 70, FIG. 11 shows a case where the number is six. Control signals RO1 to RO6 are output from the offset setting circuit 90 shown in FIG. 10.

The resistors R1 to R6 are connected in series between the power supply voltage VDD and the ground voltage VSS. The offset control signal OFS is output from between the resistors R3 and R4, that is, from the point of connection between the resistors R3 and R4. The inverters 71 to 76 receive the control signals RO1 to PO6 and output inverted signals of the control signals RO1 to RO6, respectively.

The switches SW71 to SW76 are connected in parallel to the resistors R1 to R6, respectively. The gate inputs of the N-type MOS transistors 71a to 76a are the outputs of the inverters 71 to 76, respectively. The gate inputs of the P-type MOS transistors 71b to 76b are the control signals RO1 to RO6, respectively.

The switches SW71 to SW76 can be turned on by making the control signals RO1 to RO6 high, respectively. The switches SW71 and SW76 can be turned off by making the control signals RO1 to RO6 low, respectively.

By the resistances of the resistors R1 to R6 being higher than the on-resistances of the switches SW71 to SW76, the potential of the offset control signal OFS can arbitrarily be set in a range from the power supply voltage VDD to the ground voltage VSS according to the on/off conditions of the switches SW71 to SW76. For example, when the control signals RO1 to RO4 are high and the control signals RO5 and RO6 are low, the potential of the offset control signal OFS is set to $$(R4/(R1+R2+R3+R4)) \times VDD$$

While the resistors R1 to R6 are connected in series between the power supply voltage VDD and the ground voltage VSS in FIG. 11, the internal voltage VINT may be used instead of the power supply voltage VDD. Moreover, a negative voltage such as the substrate voltage VBB may be used instead of the ground voltage VSS. In particular, when a negative voltage such as the substrate voltage VBB is used instead of the ground voltage VSS, in the first and the second embodiments, the offset level Voffset can be set up to 0 V from the relationship between the offset control signal OFS and the offset level Voffset shown in FIG. 7. Moreover, similar effects are obtained when normally-on transistors are used instead of the resistors R1 to R6.

Next, setting of the offset control signal OFS and how to use the offset control signal generating circuit shown in FIGS. 10 and 11 will be described.

First, setting of the offset control signal OFS will be described. Data of the control signals RO1 to RO6 based on a desired offset level are written from an I/O (input/output) terminal into the offset setting memory cell array 80 through the writing circuit 100. The offset setting circuit 90 reads out the data from the offset setting memory cell array 80, and outputs the control signals RO1 to RO6 to the offset control signal generating main circuit 70. The offset control signal generating main circuit 70 generates the offset control signal OFS based on the control signals RO1 to RO6 as described above. The offset control signal OFS can be set from outside by this method.

Next, how to use the offset control signal generating circuit shown in FIGS. 10 and 11 will be described. First, a test of the reading operation of the ferroelectric memory device is performed while various potentials of the offset control signal OFS are set by the above-described method of setting the offset control signal OFS. As a result, the set potential of the offset control signal OFS most suitable for the chip being tested can be detected. Then, the set potential is set again, whereby the potential of the offset control signal OFS most suitable for the chip being tested can be set. By performing this procedure for each chip, the voltage of the offset control signal OFS most suitable for each chip can be set.

The reading circuit 110 outputs the data in the offset setting memory cell array 80 to outside. By using this circuit, whether the data has correctly been written into the offset setting memory cell array 80 or not can be tested.

The pad 60B enables the voltage of the offset control signal OFS to be applied from outside the chip without the use of the above-described method of setting the offset control signal OFS. The most suitable potential of the offset control signal OFS may be detected by performing a test of the reading operation of the ferroelectric memory device while applying various voltages from outside by use of the pad 60B. In addition, whether the offset control signal generating main circuit 70 is generating a desired potential of the offset control signal OFS or not can be tested by measuring the potential of the offset control signal OFS through the pad 60B.

As described above, by using the offset control signal generating circuit shown in FIGS. 10 and 11, the reference level can be adjusted even after the design phase. Consequently, a reading operation margin can always be ensured for sample characteristic variations in a case such that the ferroelectric memory device is mass-produced.

A feature of the structure using the circuit shown in FIGS. 10 and 11 is that, since no fuses requiring cutting are used, the potential of the offset control signal OFS can be set even after the chip is sealed in a package.

Figure 12:
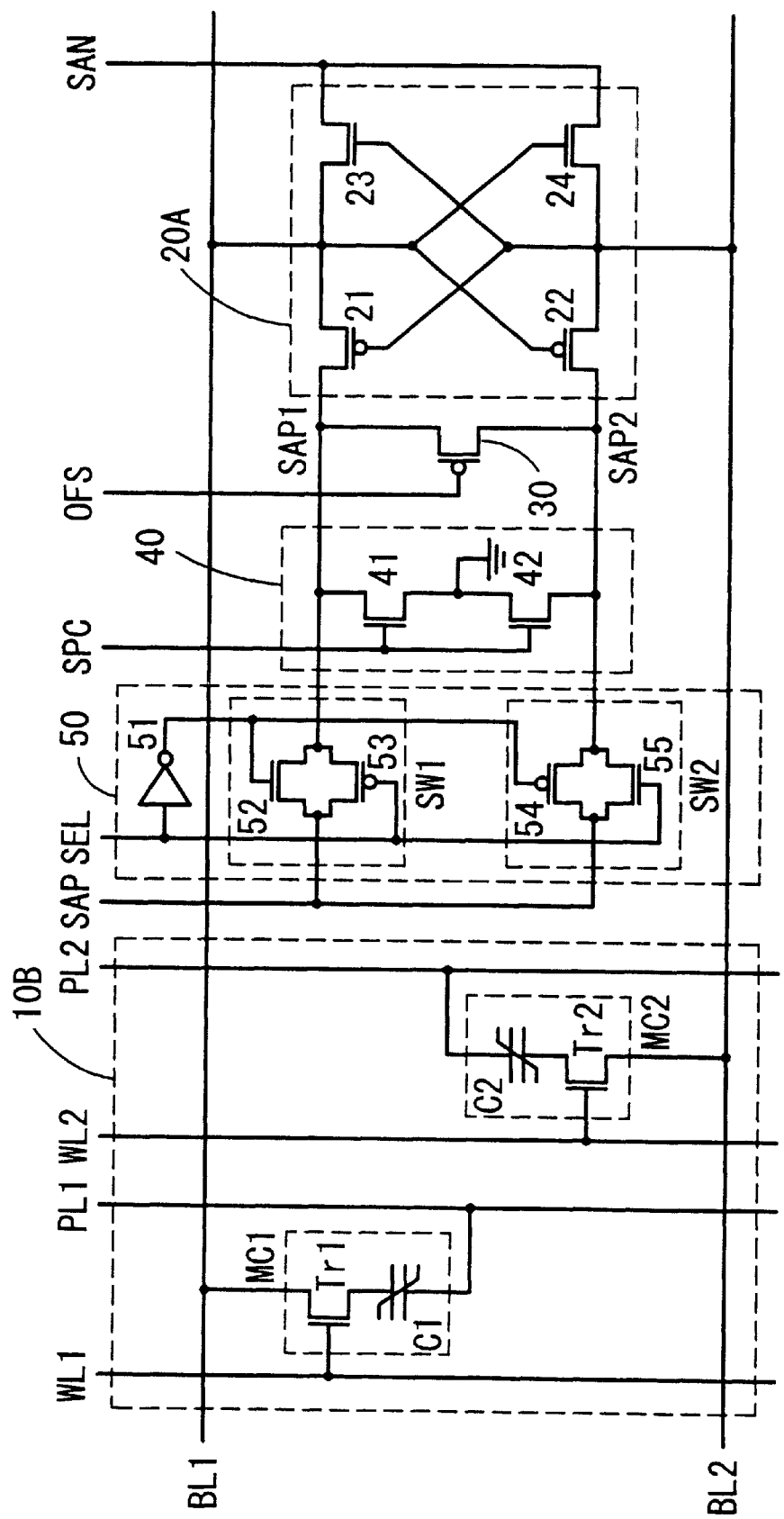
FIG. 12 is a circuit diagram showing the structure of a ferroelectric memory device according to a seventh embodiment of the present invention.

FIG. 12 is a circuit diagram showing the structure of a ferroelectric memory device according to a seventh embodiment of the present invention. In FIG. 12, reference designation 10B represents a memory cell array, reference designations Tr1 and Tr2 represent memory cell transistors, reference designations C1 and C2 represent ferroelectric capacitors, reference designations MC1 and MC2 represent memory cells, reference designations WL1 and WL2 represent word lines, reference designations BL1 and BL2 represent bit lines, reference designations PL1 and PL2 represent plate lines, reference designation 20A represents a sense amplifier, reference designations 21 and 22 represent P-type MOS transistors, reference designations 23 and 24 represent N-type MOS transistors, reference designation 30 represents a P-type MOS transistor, reference designation 40 represents a precharging circuit, reference designations 41 and 42 represent N-type MOS transistors, reference designation 50 represents a selecting circuit, reference designations SW1 and SW2 represent switches, reference designation 51 represents an inverter, reference designations 52 and 55 represent N-type MOS transistors, and reference designations 53 and 54 represent P-type MOS transistors.

The structure comprising the memory cell transistor Tr1, the ferroelectric capacitor C1, the memory cell MC1, the word line WL1, the bit lines BL1 and BL2, the plate line PL1, the sense amplifier 20A, the P-type MOS transistors 21 and 22, the N-type MOS transistors 23 and 24 and the P-type MOS transistor 30 is the same as that of FIG. 1 showing the first embodiment.

The following two points are different from the structure of FIG. 1: Firstly, the memory cell array transistor Tr2, the ferroelectric capacitor C2, the memory cell MC2, the word line WL2 and the plate line PL2 are added in the memory cell array 10B. Secondly, the precharging circuit 40 and the selecting circuit 50 are added.

The memory cell MC2 is different from the memory cell MC1 in that one of the source and drain of the memory cell transistor Tr2 is connected to the bit line BL2. The memory cell MC2 is selected by the word line WL2, and the plate line PL2 is driven, so that the data in the ferroelectric capacitor C2 is read out onto the bit line BL2.

The precharging circuit 40 precharges the nodes SAP1 and SAP2 to the ground voltage VSS. The N-type MOS transistors 41 and 42 have their gates both connected to the input node of a precharging signal SPC, their sources both connected to the node of the ground voltage VSS, and their drains connected to the nodes SAP1 and SAP2, respectively. The precharging circuit 40 turns on the N-type MOS transistors 41 and 42 and precharges the nodes SAP1 and SAP2 to the ground voltage VSS by making the precharging signal SPC high.

The selecting circuit 50 selects whether to connect the input node of the sense amplifier control signal SAP to the node SAP1 or to the node SAP2. The inverter 51 receives a selection signal SEL, and outputs an inverted signal of the selection signal SEL.

The switch SW1 is a transmission gate in which the output of the inverter 51 is input to the gate of the N-type MOS transistor 52 and the selection signal SEL is input to the gate of the P-type MOS transistor 53, and connects the input node of the sense amplifier control signal SAP to the node SAP1. The switch SW2 is a transmission gate in which the output of the inverter 51 is input to the gate of the P-type MOS transistor 54 and the selection signal SEL is input to the gate of the N-type MOS transistor 55, and connects the input node of the sense amplifier control signal SAP to the node SAP2.

When the input of the selection signal SEL is low, the switch SW1 is on and the switch SW2 is off, and the input node of the sense amplifier control signal SAP is connected to the node SAP1. When the input of the selection signal SEL is high, the switch SW1 is off and the switch SW2 is on, and the input node of the sense amplifier control signal SAP is connected to the node SAP2. With this structure, since the reference level can be adjusted, a reading operation margin can always be ensured for sample characteristic variations in a case such that the ferroelectric memory device is mass-produced.

Figure 13:
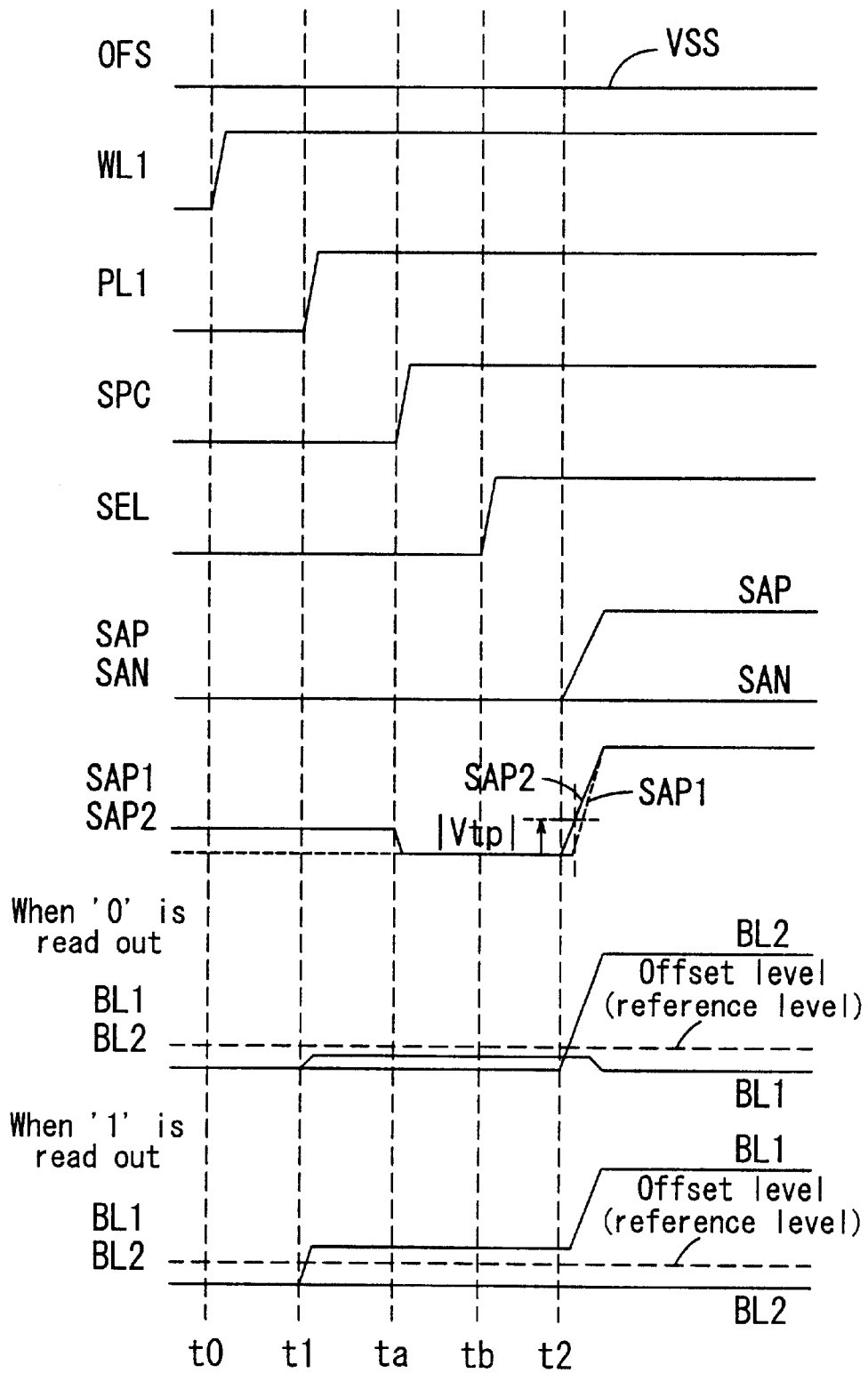
FIG. 13 is a time sequence diagram showing an operation of the ferroelectric memory device according to the seventh embodiment of the present invention.
Figure 14:
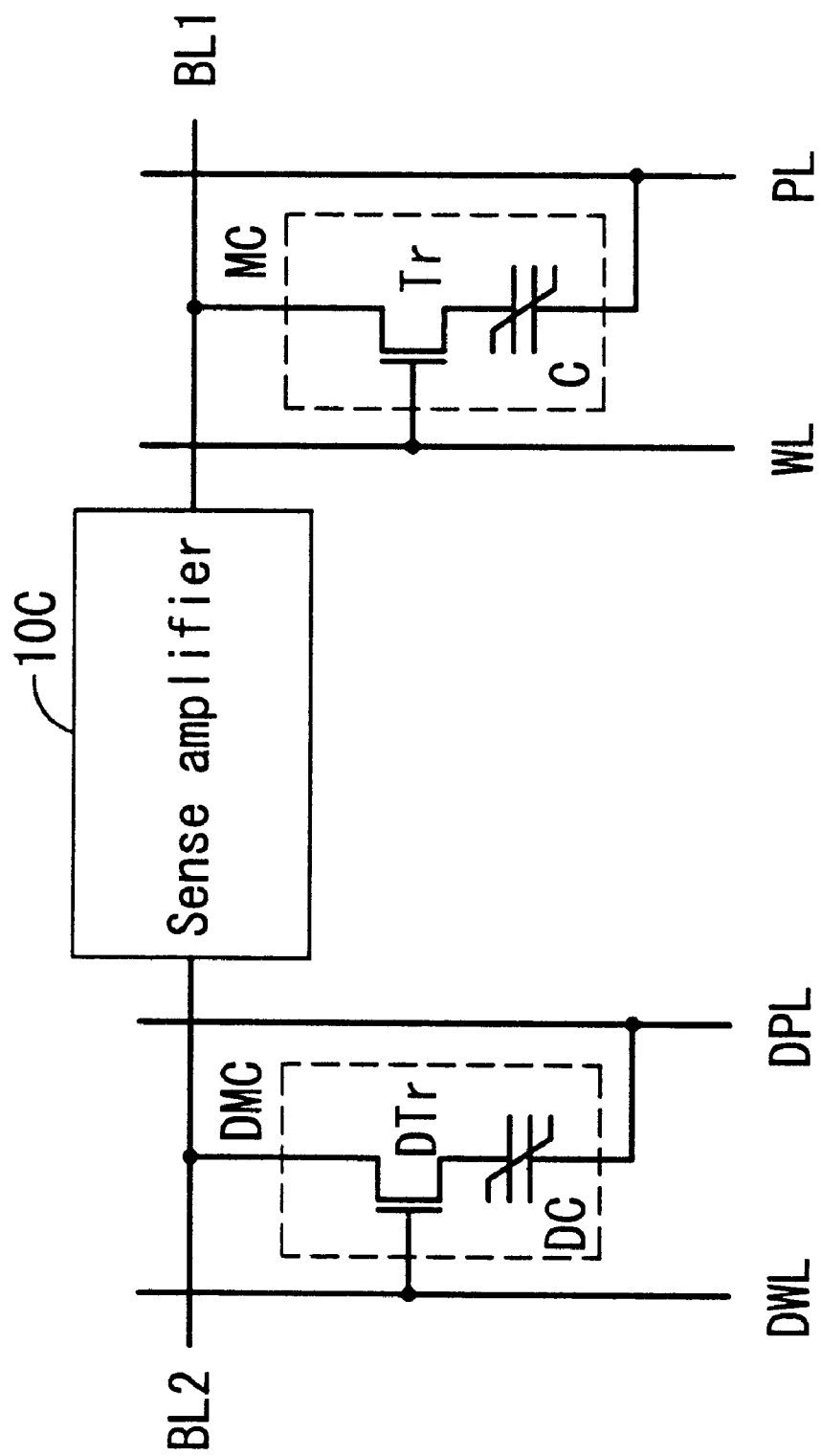
FIG. 14 is a circuit diagram showing the structure of the conventional ferroelectric memory device.

A reading operation of the ferroelectric memory device according to the seventh embodiment of the present invention will be described with reference to FIG. 13. FIG. 13 is a time sequence diagram showing the operation of the ferroelectric memory device according to the seventh embodiment. Changes of the potentials of the control signals OFS, WL1, PL1, SPC, SEL, SAP, SAN, SAP1 and SAP2, the potentials of the bit lines BL1 and BL2 when the memory cell data '0' is read out, and the potentials of the bit lines BL1 and BL2 when the memory cell data '1' is read out are shown in FIG. 13.

The operation performed when the data in the memory cell MC1 is read out will be described. The potentials of the control signals in FIG. 13 when the control signals are low are the ground voltage VSS, and the potentials when the control signals are high are the power supply voltage VDD. When an internal power supply circuit is used, the potentials when the control signals are high may be the internal voltage VINT.

The potential of the offset control signal OFS is constant at the ground voltage VSS. The absolute value of the threshold voltage Vtp of the P-type MOS transistor 30 is the median value between the bit line signal voltage when the data '0' in the memory cell MC1 is read out and the bit line signal voltage when the data '1' is read out. The bit line signal voltages are potential differences with the ground voltage VSS as the reference.

The bit lines are precharged to the ground voltage VSS in the present embodiment. The potential of the sense amplifier control signal SAN is constant at the ground voltage VSS because the N-type MOS transistors 23 and 24 of the sense amplifier 20A do not function to sense data.

The operation performed when the data in the memory cell MC1 is '0' will be described with reference to FIG. 13. The bit lines BL1 and BL2 are precharged to the ground voltage VSS before time t0.

The operations at times t0, t2 and t2 will not be described because they are the same as those in FIG. 2 showing the operation in the first embodiment.

After the data in the memory cell MC1 is read out onto the bit line BL1 through times t0 and t1, the precharging signal SPC is made high at time ta. Then, the N-type MOS transistors 41 and 42 are turned on, so that the nodes SAP1 and SAP2 are precharged to the ground voltage VSS.

Then, the selection signal SEL is made high at time tb, so that the switch SW1 is turned off and the switch SW2 is turned on. By this selection operation, the node SAP2 is connected to the input node of the sense amplifier control signal SAP, and the node SAP1 is connected to the input node of the sense amplifier control signal SAP through the P-type MOS transistor 30. Thereafter, the sense amplifier control signal SAP is driven at time t2 to thereby amplify the data on the bit lines BL1 and BL2.

When the data in the memory cell MC2 is readout, the selected word line is changed from the word line WL1 to the word line WL2, the selected plate line is changed from the plate line PL1 to the plate line PL2, and the high-level input of the selection signal SEL is changed to a low-level input. By changing the high-level input of the selection signal SEL to a low-level input, the switch SW1 is turned on and the switch SW2 is turned off in the selecting circuit 50, so that the node SAP1 is connected to the input node of the sense amplifier control signal SAP and the node SAP2 is connected to the input node of the sense amplifier control signal SAP through the P-type MOS transistor 30. The data in the memory cell MC2 is read out onto the bit line BL2.

While the selection signal SEL is activated after the precharging signal SPC is activated in the above-described operation, it may be activated before the precharging signal SPC is activated. While the selection signal SEL and the precharging signal SPC are activated after the word line WL1 and the plate line PL1 are activated, they may be activated before the word line WL1 and the plate line PL1 are activated.

By providing the precharging circuit 40, the nodes SAP1 and SAP2 can be precharged with reliability, so that a circuit structure with higher reading accuracy, compared with the ferroelectric memory device of the first embodiment, can be realized.

By providing the selecting circuit 50, data can also be read out onto the bit line BL2 by connecting the memory cell, so that a denser memory cell array, compared with the ferroelectric memory device of the first embodiment, can be realized.

While the ferroelectric memory of the seventh embodiment has a structure that the precharging circuit 40 and the selecting circuit 50 are added to the ferroelectric memory device of the first embodiment, it is obvious that the same effects are obtained by adding the precharging circuit 40 and the selecting circuit 50 to the ferroelectric memory devices of the second to the fourth embodiments. In this case, in the ferroelectric memory devices of the third and the fourth embodiments, changes are necessary such that the precharging circuit 40 comprises P-type MOS transistors instead of the N-type MOS transistors 41 and 42 so that the nodes SAP1 and SAP2 are precharged to the power supply voltage VDD.

Effects of the embodiments will be described.

According to the ferroelectric memory device of the first or the second embodiment, since the offset level is generated in the sense amplifier 20A or 20B by the P-type MOS transistor 30, the reference level can be generated without the use of a dummy cell. Consequently, the problem of reference level variations caused by an access frequency difference between the memory cell and the dummy cell does not arise. In addition, a period for writing predetermined data into the dummy cell is unnecessary. As a result, a high-speed, high-reliability ferroelectric memory device can be provided.

According to the ferroelectric memory device of the third or the fourth embodiment, since the offset level is generated in the sense amplifier 20A or 20C by the N-type MOS transistor 31, the reference level can be generated without the use of a dummy cell. Consequently, the problem of reference level variations caused by an access frequency difference between the memory cell and the dummy cell does not arise. In addition, a period for writing predetermined data into the dummy cell is unnecessary. As a result, a high-reliability ferroelectric memory device can be provided.

With respect to setting of the offset level, since the offset level can be changed by changing the potential of the offset control signal OFS, the reference level can easily be designed in the design phase of the ferroelectric memory device.

According to the ferroelectric memory device of the fifth or the sixth embodiment, since the reference level can easily be changed even after the design phase of the ferroelectric memory device by using the resistors R1 to R6 and the fuses F1 to F6 or the switches SW71 to SW76, a reading operation margin can always be ensured for sample characteristic variations in a case such that the ferroelectric memory device is mass-produced.

According to the ferroelectric memory device of the seventh embodiment, since the nodes SAP1 and SAP2 can be precharged with reliability by providing the precharging circuit 40 in addition to the features of the ferroelectric memory device of the first, the second, the third or the fourth embodiment, the reading operation can more accurately be performed. Since data can also be read out onto the bit line BL2 by connecting the memory cell by providing the selecting circuit 50, a denser memory cell array can be structured.

What is claimed is:

1. A ferroelectric memory device comprising:
   first and second bit lines;
   a first memory cell transistor;
   a first ferroelectric capacitor connected to said first bit line through the first memory cell transistor, said first ferroelectric capacitor being included in a first memory cell array;
   a sense amplifier connected to said first and second bit lines, and having first and second control terminals corresponding to said first and second bit lines; and
   an offset generating transistor connected between said first and second control terminals, and supplying an offset to said sense amplifier.

2. A ferroelectric memory device according to claim 1, wherein said sense amplifier comprises:
   a first P-type MOS transistor having its gate connected to said second bit line, its drain connected to said first bit line, and its source connected to said first control terminal;
   a second P-type MOS transistor having its gate connected to said first bit line, its drain connected to said second bit line, and its source connected to said second control terminal;
   a first N-type MOS transistor having its gate connected to said second bit line, its drain connected to said first bit line, and its source connected to a third control terminal; and
   a second N-type MOS transistor having its gate connected to said first bit line, its drain connected to said second bit line, and its source connected to said third control terminal, and
   wherein said offset generating transistor comprises a third P-type MOS transistor having its source and drain connected to said first and second control terminals, and a control signal of said sense amplifier is input to said second control terminal.

3. A ferroelectric memory device according to claim 1, wherein said sense amplifier comprises:
   a first P-type MOS transistor having its gate connected to said second bit line, its drain connected to a first data line, and its source connected to said first control terminal; and
   a second P-type MOS transistor having its gate connected to said first bit line, its drain connected to a second data line, and its source connected to said second control terminal, and
   wherein said offset generating transistor comprises a third P-type MOS transistor having its source and drain connected to said first and second control terminals, and a control signal of said sense amplifier is input to said second control terminal.

4. A ferroelectric memory device according to claim 1, wherein said sense amplifier comprises:
   a first N-type MOS transistor having its gate connected to said second bit line, its drain connected to said first bit line, and its source connected to said first control terminal;
   a second N-type MOS transistor having its gate connected to said first bit line, its drain connected to said second bit line, and its source connected to said second control terminal;
   a first P-type MOS transistor having its gate connected to said second bit line, its drain connected to said first bit line, and its source connected to a third control terminal; and
   a second P-type MOS transistor having its gate connected to said first bit line, its drain connected to said second bit line, and its source connected to said third control terminal, and
   wherein said offset generating transistor comprises a third N-type MOS transistor having its source and drain connected to said first and second control terminals, and a control signal of said sense amplifier is input to said second control terminal.

5. A ferroelectric memory device according to claim 1, wherein said sense amplifier comprises:
   a first N-type MOS transistor having its gate connected to said second bit line, its drain connected to said first data line, and its source connected to said first control terminal; and
   a second N-type MOS transistor having its gate connected to said first bit line, its drain connected to said second data line, and its source connected to said second control terminal, and
   wherein said offset generating transistor comprises a third N-type MOS transistor having its source and drain connected to said first and second control terminals, and a control signal of said sense amplifier is input to said second control terminal.

6. A ferroelectric memory device according to claim 2, wherein an offset level Voffset of said sense amplifier is set by setting a gate potential Vg of said third P-type MOS transistor based on the following relationship:

$$Voffset = Vg - Vtp$$

where Vg is the gate potential of said third P-type MOS transistor, Vtp is a threshold voltage of said third P-type MOS transistor, and Voffset is the offset level of said sense amplifier.

7. A ferroelectric memory device according to claim 3, wherein an offset level Voffset of said sense amplifier is set by setting a gate potential Vg of said third P-type MOS transistor based on the following relationship:

$$Voffset=Vg-Vtp$$

where Vg is the gate potential of said third P-type MOS transistor, Vtp is a threshold voltage of said third P-type MOS transistor, and Voffset is the offset level of said sense amplifier.

8. A ferroelectric memory device according to claim 4, wherein an offset level Voffset of said sense amplifier is set by setting a gate potential Vg of said third N-type MOS transistor based on the following relationship:

$$Voffset=Vg-Vtn-VDD$$

where Vg is the gate potential of said third N-type MOS transistor, Vtn is a threshold voltage of said third N-type MOS transistor, Voffset is the offset level of said sense amplifier, and VDD is a power supply voltage.

9. A ferroelectric memory device according to claim 5, wherein an offset level Voffset of said sense amplifier is set by setting a gate potential Vg of said third N-type MOS transistor based on the following relationship:

$$Voffset=Vg-Vtn-VDD$$

where Vg is the gate potential of said third N-type MOS transistor, Vtn is a threshold voltage of said third N-type MOS transistor, Voffset is the offset level of said sense amplifier, and VDD is a power supply voltage.

10. A ferroelectric memory device according to claim 6, further comprising:
   an offset control signal generating circuit setting a potential that is input to a gate of said third P-type MOS transistor; and
   a pad connected to the gate of said third P-type MOS transistor.

11. A ferroelectric memory device according to claim 7, further comprising:
   an offset control signal generating circuit setting a potential that is input to a gate of said third P-type MOS transistor; and
   a pad connected to the gate of said third P-type MOS transistor.

12. A ferroelectric memory device according to claim 10, wherein said offset control signal generating circuit comprises:
   first and second terminals to which a first predetermined voltage and a second predetermined voltage are applied, respectively;
   a plurality of resistors connected in series between said first and second terminals;
   a plurality of fuses connected in parallel to said resistors, respectively; and
   a third terminal outputting an offset control signal from one of points of connection between said resistors.

13. A ferroelectric memory device according to claim 11, wherein said offset control signal generating circuit comprises:
   first and second terminals to which a first predetermined voltage and a second predetermined voltage are applied, respectively;
   a plurality of resistors connected in series between said first and second terminals;
   a plurality of fuses connected in parallel to said resistors, respectively; and
   a third terminal outputting an offset control signal from one of points of connection between said resistors.

14. A ferroelectric memory device according to claim 10, wherein said offset control signal generating circuit comprises:
   first and second terminals to which a first predetermined voltage and a second predetermined voltage are applied, respectively;
   a plurality of resistors connected in series between said first and second terminals;
   a plurality of switches connected in parallel to said resistors, respectively;
   a third terminal outputting an offset control signal from one of points of connection between said resistors;
   a second memory cell array in which setting of said switches is stored;
   means for reading out data in said second memory cell array, and controlling on/off of said switches;
   means for writing data into said second memory cell array from outside a chip; and
   means for reading out data in said second memory cell array, to outside the chip.

15. A ferroelectric memory device according to claim 11, wherein said offset control signal generating circuit comprises:
   first and second terminals to which a first predetermined voltage and a second predetermined voltage are applied, respectively;
   a plurality of resistors connected in series between said first and second terminals;
   a plurality of switches connected in parallel to said resistors, respectively;
   a third terminal outputting an offset control signal from one of points of connection between said resistors;
   a second memory cell array in which setting of said switches is stored;
   means for reading out data in said second memory cell array, and controlling on/off of said switches;
   means for writing data into said second memory cell array from outside a chip; and
   means for reading out data in said second memory cell array, to outside the chip.

16. A ferroelectric memory device according to claim 8, further comprising:
   an offset control signal generating circuit setting a potential that is input to a gate of said third N-type MOS transistor; and
   a pad connected to the gate of said third N-type MOS transistor.

17. A ferroelectric memory device according to claim 9, further comprising:
   an offset control signal generating circuit setting a potential that is input to a gate of said third N-type MOS transistor; and
   a pad connected to the gate of said third N-type MOS transistor.

18. A ferroelectric memory device according to claim 16, wherein said offset control signal generating circuit comprises:
   first and second terminals to which a first predetermined voltage and a second predetermined voltage are applied, respectively;

a plurality of resistors connected in series between said first and second terminals;

a plurality of fuses connected in parallel to said resistors, respectively; and a third terminal outputting an offset control signal from one of points of connection between said resistors.

19. A ferroelectric memory device according to claim 17, wherein said offset control signal generating circuit comprises:

first and second terminals to which a first predetermined voltage and a second predetermined voltage are applied, respectively;

a plurality of resistors connected in series between said first and second terminals;

a plurality of fuses connected in parallel to said resistors, respectively; and a third terminal outputting an offset control signal from one of points of connection between said resistors.

20. A ferroelectric memory device according to claim 16, wherein said offset control signal generating circuit comprises:

first and second terminals to which a first predetermined voltage and a second predetermined voltage are applied, respectively;

a plurality of resistors connected in series between said first and second terminals;

a plurality of switches connected in parallel to said resistors, respectively;

a third terminal outputting an offset control signal from one of points of connection between said resistors;

a second memory cell array in which setting of said switches is stored;

means for reading out data in said second memory cell array, and controlling on/off of said switches;

means for writing data into said second memory cell array from outside a chip; and means for reading out data in said second memory cell array, to outside the chip.

21. A ferroelectric memory device according to claim 17, wherein said offset control signal generating circuit comprises:

first and second terminals to which a first predetermined voltage and a second predetermined voltage are applied, respectively;

a plurality of resistors connected in series between said first and second terminals;

a plurality of switches connected in parallel to said resistors, respectively;

a third terminal outputting an offset control signal from one of points of connection between said resistors;

a second memory cell array in which setting of said switches is stored;

means for reading out data in said second memory cell array, and controlling on/off of said switches;

means for writing data into said second memory cell array from outside a chip; and means for reading out data in said second memory cell array, to outside the chip.

22. A ferroelectric memory device according to claim 2, further comprising means for precharging said first and second control terminals to a predetermined voltage.

23. A ferroelectric memory device according to claim 3, further comprising means for precharging said first and second control terminals to a predetermined voltage.

24. A ferroelectric memory device according to claim 4, further comprising means for precharging said first and second control terminals to a predetermined voltage.

25. A ferroelectric memory device according to claim 5, further comprising means for precharging said first and second control terminals to a predetermined voltage.

26. A ferroelectric memory device according to claim 1, further comprising:

a second memory cell transistor;

a second ferroelectric capacitor connected to said second bit line through the second memory cell transistor, said second ferroelectric capacitor being included in said first memory cell array; and a selecting circuit connecting a control signal of said sense amplifier to said second control terminal when data in said first ferroelectric capacitor is read out, and connecting the control signal of said sense amplifier to said first control terminal when data in said second ferroelectric capacitor is read out.

* * * * *